US011221379B2

(12) United States Patent
Chen et al.

(10) Patent No.: US 11,221,379 B2
(45) Date of Patent: Jan. 11, 2022

(54) SYSTEMS AND METHODS FOR ON-CHIP TIME-DOMAIN REFLECTOMETRY

(71) Applicant: MEDIATEK Singapore Pte. Ltd., Singapore (SG)

(72) Inventors: Huan-Sheng Chen, Hsin-Chu (TW); Henry Arnold Park, San Jose, CA (US); Tamer Mohammed Ali, San Jose, CA (US)

(73) Assignee: MEDIATEK Singapore Pte. Ltd., Singapore (SG)

( * ) Notice: Subject to any disclaimer, the term of this patent is extended or adjusted under 35 U.S.C. 154(b) by 92 days.

(21) Appl. No.: 16/846,024

(22) Filed: Apr. 10, 2020

(65) Prior Publication Data
US 2020/0309864 A1    Oct. 1, 2020

Related U.S. Application Data

(63) Continuation-in-part of application No. 15/997,476, filed on Jun. 4, 2018, now Pat. No. 10,732,215.
(Continued)

(51) Int. Cl.
*G01R 31/58* (2020.01)
*H03K 5/24* (2006.01)
(Continued)

(52) U.S. Cl.
CPC .............. *G01R 31/58* (2020.01); *G01R 31/11* (2013.01); *G01R 31/52* (2020.01); *G01R 31/54* (2020.01); *H03K 5/24* (2013.01)

(58) Field of Classification Search
CPC ........ G01R 31/58; G01R 31/11; G01R 31/54; G01R 31/52; G01R 31/71; G01R 31/2812; H03K 5/24
(Continued)

(56) References Cited

U.S. PATENT DOCUMENTS

| 4,139,822 A | 2/1979 | Urich et al. |
| 4,929,904 A | 5/1990 | Bohman et al. |

(Continued)

FOREIGN PATENT DOCUMENTS

| CN | 101566665 A | 10/2009 |
| CN | 103954886 A | 7/2014 |

(Continued)

OTHER PUBLICATIONS

Extended European Search Report dated Feb. 3, 2021 in connection with European Application No. 20190824.1.
(Continued)

*Primary Examiner* — Giovanni Astacio-Oquendo
(74) *Attorney, Agent, or Firm* — Wolf, Greenfield & Sacks, P.C.

(57) ABSTRACT

Systems and methods for detecting the presence and/or location of defects (e.g., incomplete solders, broken cables, misconnections, defective sockets, opens, shorts, etc.) along electrical lines are described. The systems and methods described herein may use time-domain reflectometry (TDR), a measurement technique used to determine the characteristics of electrical lines by observing reflected waveforms. TDR may be performed in some embodiments by determining the times when a first event and a second event occur, and by determining the space traveled by a probe signal based on these times. The first event may occur when a first signal transition crosses a first threshold and the second event may occur when a second signal transition crosses a second threshold, where the second signal transition may arise in response to the first signal transition reflecting against a defect along the electrical line.

20 Claims, 18 Drawing Sheets

Related U.S. Application Data

(60) Provisional application No. 62/902,429, filed on Sep. 19, 2019, provisional application No. 62/608,654, filed on Dec. 21, 2017.

(51) Int. Cl.
  *G01R 31/11* (2006.01)
  *G01R 31/54* (2020.01)
  *G01R 31/52* (2020.01)

(58) Field of Classification Search
  USPC .......................... 324/533, 532, 527, 512, 500
  See application file for complete search history.

(56) References Cited

U.S. PATENT DOCUMENTS

| | | |
|---|---|---|
| 5,268,644 A | 12/1993 | Klassen et al. |
| 5,319,311 A | 6/1994 | Kawashima et al. |
| 5,521,512 A | 5/1996 | Hulina |
| 5,629,825 A | 5/1997 | Wallis et al. |
| 6,144,210 A | 11/2000 | Brooks |
| 6,509,740 B1 | 1/2003 | Needle et al. |
| 6,853,196 B1 | 2/2005 | Barnum et al. |
| 7,279,908 B2 | 10/2007 | Blake |
| 7,675,544 B2 | 3/2010 | Koo et al. |
| 8,499,622 B2 | 8/2013 | Gaisnon et al. |
| 10,732,215 B2 | 8/2020 | Park et al. |
| 2003/0118832 A1 | 6/2003 | Skaling et al. |
| 2006/0097719 A1 | 5/2006 | Moore |
| 2009/0058456 A1* | 3/2009 | Okayasu ............... H01L 22/20 324/750.3 |
| 2009/0205363 A1 | 8/2009 | de Strulle |
| 2010/0176815 A1 | 7/2010 | Roth |
| 2010/0211338 A1 | 8/2010 | Ravot et al. |
| 2011/0285400 A1 | 11/2011 | Defoort et al. |
| 2015/0077131 A1 | 3/2015 | Incarbone et al. |
| 2016/0202302 A1 | 7/2016 | Cooper et al. |
| 2016/0266194 A1* | 9/2016 | Ben Hassen ........... G01R 31/11 |
| 2017/0023632 A1 | 1/2017 | Johnson et al. |
| 2017/0153284 A1 | 6/2017 | Loete et al. |
| 2019/0189038 A1* | 6/2019 | Park ..................... G09G 3/3291 |
| 2019/0195936 A1 | 6/2019 | Park et al. |

FOREIGN PATENT DOCUMENTS

| | | |
|---|---|---|
| CN | 104145188 A | 11/2014 |
| CN | 105940310 A | 9/2016 |
| CN | 106124925 A | 11/2016 |
| CN | 107064724 A | 8/2017 |
| EP | 0 450 806 A2 | 10/1991 |
| EP | 3 502 717 A | 6/2019 |
| TW | 2005-35440 A | 11/2005 |
| TW | 2007-10412 A | 3/2007 |
| TW | 2010-17189 A | 5/2010 |
| TW | 2011-13539 A | 4/2011 |
| TW | 2013-33496 A | 8/2013 |
| TW | 2015-16994 A | 5/2015 |
| TW | 2015-37185 A | 10/2015 |
| TW | 2019-28373 A | 7/2019 |
| WO | WO 2017/086948 A1 | 5/2017 |
| WO | WO 2017/148753 A1 | 9/2017 |

OTHER PUBLICATIONS

European Search Report and Written Opinion for European Application No. 18191220.5 dated Mar. 14, 2019.

* cited by examiner

| $\Phi_0$ | 1st clock cycle | 2nd clock cycle | 3rd clock cycle |
|---|---|---|---|
| $V_0$ | 1 | 1 | 1 |
| $V_1$ | 0 | 1 | 1 |
| $V_2$ | 0 | 0 | 1 |
| $V_3$ | 0 | 0 | 0 |

FIG. 8E

| $\Phi_1$ | 1st clock cycle | 2nd clock cycle | 3rd clock cycle |
|---|---|---|---|
| $V_0$ | 1 | 1 | 1 |
| $V_1$ | 0 | 1 | 1 |
| $V_2$ | 0 | 0 | 1 |
| $V_3$ | 0 | 0 | 0 |

FIG. 8F

| $\Phi_2$ | 1st clock cycle | 2nd clock cycle | 3rd clock cycle |
|---|---|---|---|
| $V_0$ | 1 | 1 | 1 |
| $V_1$ | 0 | 1 | 1 |
| $V_2$ | 0 | 0 | 1 |
| $V_3$ | 0 | 0 | 0 |

FIG. 8G

| $\Phi_3$ | 1st clock cycle | 2nd clock cycle | 3rd clock cycle |
|---|---|---|---|
| $V_0$ | 1 | 1 | 1 |
| $V_1$ | 1 | 1 | 1 |
| $V_2$ | 0 | 0 | 1 |
| $V_3$ | 0 | 0 | 0 |

FIG. 8H

SYSTEMS AND METHODS FOR ON-CHIP TIME-DOMAIN REFLECTOMETRY

This Application claims priority under 35 U.S.C. § 119(e) to U.S. Provisional Application Ser. No. 62/902,429, entitled "SYSTEMS AND METHODS FOR ON-CHIP TIME-DOMAIN REFLECTOMETRY," filed on Sep. 19, 2019, which is herein incorporated by reference in its entirety.

This Application is a continuation-in-part, and claims the benefit under 35 U.S.C. § 120, of U.S. application Ser. No. 15/997,476, entitled "SYSTEMS AND METHODS FOR ON-CHIP TIME-DOMAIN REFLECTOMETRY," filed on Jun. 4, 2018, which claims priority under 35 U.S.C. § 119(e) to U.S. Provisional Application Ser. No. 62/608,654, entitled "ON-CHIP TIME-DOMAIN REFLECTOMETER," filed on Dec. 21, 2017, each of which is herein incorporated by reference in its entirety.

BACKGROUND

Electronic systems are inevitably subject to defective parts, such as incomplete solders, broken cables, misconnections, defective sockets, etc. These defective parts can negatively affect, or even destroy, the operation of the electronic systems. Detection of these defective parts is very onerous, since it involves disassembling the entire system and then probing all its parts until the defect is identified. This process is especially cumbersome in data center applications, in which the number of lines and connections can be in the thousands or even more.

BRIEF SUMMARY

Some embodiments relate to a method for determining a location of a defect in an electrical line of an electronic system, the method comprising: with a control circuit, outputting a first signal transition onto the electrical line; with the control circuit, receiving a second signal transition arising in response to a reflection of the first signal transition from the defect; determining an occurrence of a first event based on the first signal transition crossing a first threshold; determining an occurrence of a second event based on the second signal transition crossing a second threshold; and determining the location of the defect based on a timing of the occurrence of the first event and a timing of the occurrence of the second event.

Some embodiments relate to a method for determining a location of a defect in an electrical line of an electronic system, the method comprising: (i) setting a value of a first threshold and a value of a second threshold; (ii) outputting a first signal transition onto the electrical line; (iii) receiving a second signal transition arising in response to a reflection of the first signal transition from the defect; (iv) determining an occurrence of a first event based on the first signal transition crossing a first threshold; (v) determining an occurrence of a second event based on the second signal transition crossing a second threshold; (vi) varying the value of the first threshold and/or the value of the second threshold; (vii) repeating (ii)-(vi) N times, wherein N>0; (viii) computing a first representative measurement value based on at least some of the occurrences of the first events and computing a second representative measurement value based on at least some of the occurrences of the second events; and (ix) determining the location of the defect based on the first representative measurement value and the second representative measurement value.

Some embodiments relate to an apparatus for determining a location of a defect in an electrical line of an electronic system, the apparatus comprising: a control circuit configured to: output a first signal transition onto the electrical line; receive a second signal transition arising in response to a reflection of the first signal transition from the defect; determine an occurrence of a first event based on the first signal transition crossing a first threshold; determine an occurrence of a second event based on the second signal transition crossing a second threshold; and determine the location of the defect based on a timing of the occurrence of the first event and a timing of the occurrence of the second event.

Some embodiments relate to a method for determining a characteristic of a defect in an electrical line of an electronic system. The method comprises: (i) selecting a first clock signal among a plurality of selectable clock signals; (ii) selecting a first reference voltage among a plurality of selectable reference voltages; (iii) obtaining a signal by: producing a first signal transition onto the electrical line; and receiving a second signal transition arising in response to a reflection of the first signal transition from the defect; (iv) producing a plurality of numerical values by sampling the signal using the selected clock signal; (v) producing a plurality of output values by comparing the plurality of numerical values with the selected reference voltage; and (vi) determining the characteristic of the defect based on the plurality of output values.

Some embodiments relate to an apparatus for determining a characteristic of a defect in an electrical line of an electronic system. The apparatus comprises: an integrated circuit (IC) configured to: (i) select a first clock signal among a plurality of selectable clock signals; (ii) select a first reference voltage among a plurality of selectable reference voltages; (iii) obtain a signal by: producing a first signal transition onto the electrical line; and receiving a second signal transition arising in response to a reflection of the first signal transition from the defect; (iv) produce a plurality of numerical values by sampling the signal using the selected clock signal; (v) produce a plurality of output values by comparing the plurality of numerical values with the selected reference voltage; and (vi) determine the characteristic of the defect based on the plurality of output values.

Some embodiments relate to an apparatus comprising: an integrated circuit (IC) comprising: a transmitter; a signal driver coupled to the transmitter and to an electrical line; an analog-to-digital converter (ADC) coupled to the electrical line; a clock selection circuit coupled to a clock input of the ADC, the clock selection circuit being configured to select a first clock signal among a plurality of selectable clock signals; a reference voltage generator configured to select a reference voltage among a plurality of selectable reference voltages; a comparator having a first input coupled to the ADC and a second input coupled to the reference voltage generator; and a time-domain reflectometry (TDR) circuit coupled to an output of the comparator.

The foregoing summary is provided by way of illustration and is not intended to be limiting.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing.

FIGS. 8E-8H are tables representing a plurality of output values, in accordance with some non-limiting embodiments.

DETAILED DESCRIPTION

I. Overview

Figure 1:
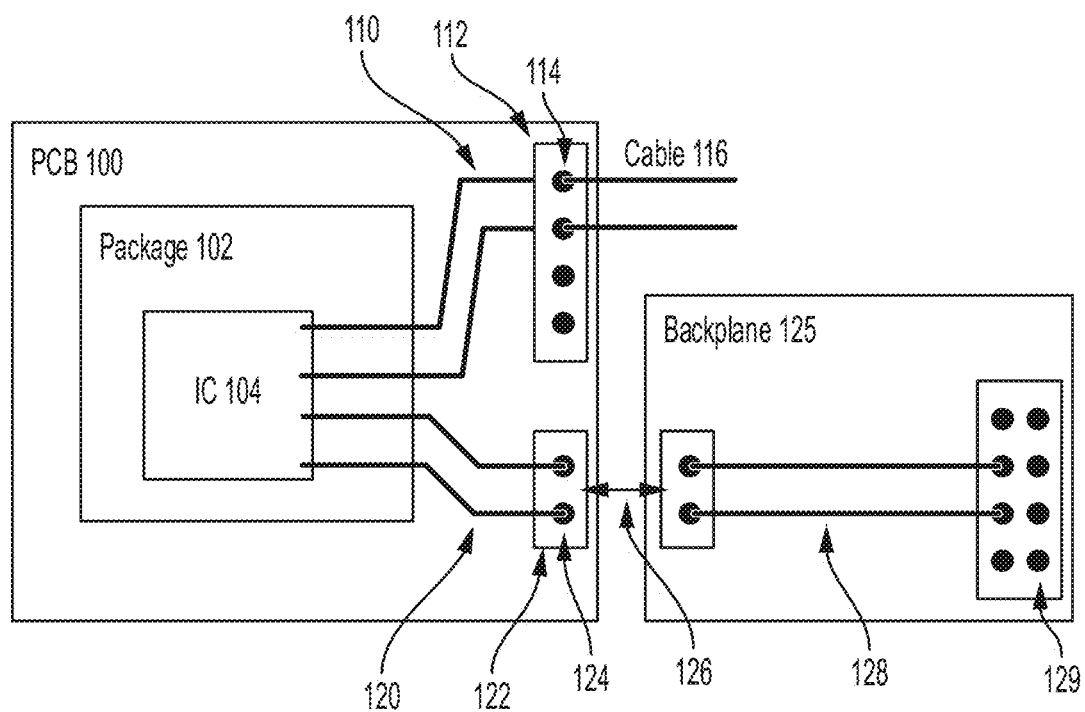
FIG. 1 is a schematic diagram illustrating an electronic system with various electronic components interconnected to each other via electrical lines, according to some non-limiting embodiments.

The inventors have developed circuits for detecting the presence, location and/or other characteristics of defects (such as incomplete solders, broken cables, misconnections, defective sockets, opens, shorts, etc.) in large electronic systems that can be co-integrated with other electronic circuits. The circuits developed by the inventors are based on time-domain reflectometry (TDR), a measurement technique used to determine the characteristics of electrical lines by observing reflected waveforms.

Conventional techniques rely on dedicated hardware for performing time-domain reflectometry. As a result, performing time-domain reflectometry on a system may involve several steps before the system can be tested. Some such steps include, for example, powering down the system, disconnecting cables or other connectors from the system, moving the system to a suitable location for testing, and connecting the system to be tested to a dedicated TDR instrument. The result is the disruption of the regular operation of the system when a test is needed.

The TDR circuits developed by the inventors are co-integrated directly with the system to be tested. This means that the system may be tested for the presence or other characteristics of defects without having to disrupt its operations. Being co-integrated, in some embodiments, a TDR circuit may share hardware with other electronic circuits. For example, the same transmitter hardware may serve both as data transmitter and as TDR transmitter. Having shared hardware is particularly suitable for use in connection with large-scale circuits, such as those used in data centers, which can include several thousands of transmitters. In this scenario, in fact, instead of having to design ad-hoc TDR transmitters, designers of TDR systems may leverage existing transmitter hardware, thus reducing design and fabrication costs.

The inventors have appreciated that different methods for performing TDR may be used depending on what defect characteristic(s) a user wishes to determine. In some circumstances, a user may wish to determine the location of a defect, but may not care to know other characteristics of the defect. In these circumstances, the user may be able to take proper measures based on the location of the defect but without necessarily knowing other characteristics. Some embodiments of the present application are directed to methods and circuits for determining the location of a defect. Such embodiments may relay on the use of threshold voltages to identify the timing of certain signal transitions, and to determine the location of a defect based on the timing of these transitions. Such methods are referred to herein as "non-digitizing methods for time-domain reflectometry" or simply "non-digitizing TDR methods."

In other circumstances, however, a user may wish to determine other characteristics of a defect, in addition or in alternative to the location. For example, a user may wish to determine the impedance of a defect, which in turn, may provide an indication of the nature of the defect. The user may use information relating to the nature of defects to discriminate between serious defects (e.g., defects that require repair) and non-serious defects (e.g., defects that do not require repair). Some embodiments of the present application are directed to methods and circuits for determining characteristics of a defect in addition, or in alternative, to the location of the defect. Such embodiments may rely on the use of analog-to-digital converters to profile the waveform of a TDR signal, and may include circuits that determine a characteristic of a defect based on the profile. Such methods are referred to herein as "digitizing methods for time-domain reflectometry" or simply "digitizing TDR methods."

II. Non-Digitizing Methods for Time-Domain Reflectometry

FIG. 1 illustrates an example of an electronic system including multiple electrical lines, according to some non-limiting embodiments. This specific example illustrates an integrated circuit (IC) 104 disposed on a package 102, which is in turn disposed on a printed circuit board (PCB) 100. IC 104 may include various types of analog and/or digital circuits, micromachined (MEMS) devices, sensors and/or other electronic components. IC 104 may include, among others, a processor, a field programmable gate array (FPGA) an application specific integrated circuit (ASIC), a memory unit, and/or any other suitable component. IC 104 may be programmed with instructions that, when executed, carry out different tasks such as transmitting, receiving, and/or processing signals in any suitable manner.

In this example, IC 104 is connected to several electrical lines, where the opposite ends of the electrical lines may be connected to other electronic devices. In some embodiments, IC 104 may be connected to hundreds or even thousands of electrical lines. Each electrical line may include different physical transmission media, such as cables, wires, metal traces, pins, contacts, solders, connectors, sockets, etc. For example, an electrical line may include metal line 110 (which may in turn include a metal trace formed on the package 102, a metal trace formed on PCB 100 and a connector interfacing the metal traces), a contact 114 of connector 112 and cable 116. The other end of cable 116 (not illustrated in FIG. 1) may be connected to some other component or conductive path. Another electrical line may include metal line 120, contact 124 of connector 122, a cable 126, a contact on backplane 125, a metal trace 128 on backplane 125, a connector 129, etc.

Each of the electrical lines connected to IC 104 may, at least in theory, be susceptible to defects. For example, a solder may have been only partially formed, a cable may be defective, a pair of contacts may be mated to one another improperly, a misconnection between pins may occur, a socket may be defective, etc. Such defects may alter the electrical characteristics of the electrical lines. Open or shorts may arise, for example. Additionally, or alternatively, the impedance (e.g., the resistance, capacitance and/or inductance) of the electrical line may increase or otherwise deviate from the expected value. In general, defects in electrical lines are undesirable as they negatively alter the behavior of the electronic system.

Identification of a defect is often a challenging task. First, it may be difficult to identify which electronic components share a defective electrical line. Second, it may be difficult to identify which specific electrical line is defective. Third, it may be difficult to identify which specific component or location along an electrical line is defective. These tasks may be particularly challenging in complex electronic systems, in which there may be several thousands of electrical lines. The techniques described herein provide a practical way for identifying the presence and location of defects in complex systems.

Figure 2A:
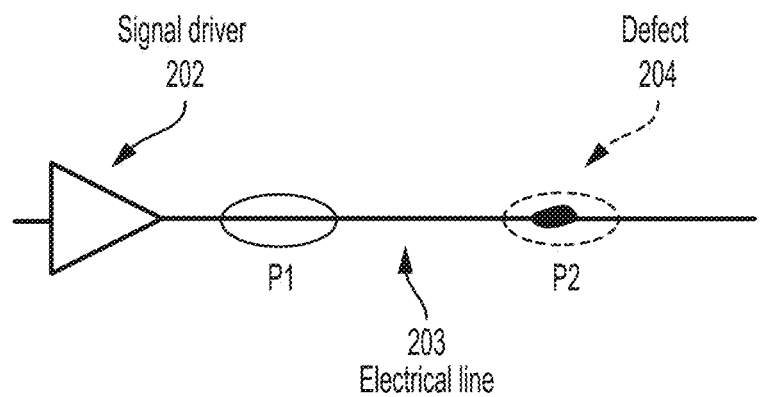
FIG. 2A is a schematic diagram illustrating a signal driver and an electrical line having a defect, according to some non-limiting embodiments.

FIG. 2A is a schematic diagram illustrating an electrical line 203 and a signal driver 202 in electrical communication with electrical line 203. Signal driver 202 may be part of IC 104. Signal driver 202 may include circuitry for generating signals to be transmitted across the electrical line 203. For example, signal driver 202 may include amplifiers, buffers, digital-to-analog converters, etc. In this example, electrical line 203 includes a defect 204. The defect 204 may be due to a misconnection, a poorly made solder, a damaged cable, among other possible causes. The presence and the location of defect 204 may be unknown to the user/operator of the electronic system. Depending on its nature, the defect may give rise to an open circuit, to a short circuit to ground, or may simply cause the impedance of the line to deviate from the expected value. In some embodiments, for example, the line's expected impedance is 50Ω but the presence of the defects raises the impedance above or 50Ω, or decreases the impedance below 50Ω.

Figure 2B:
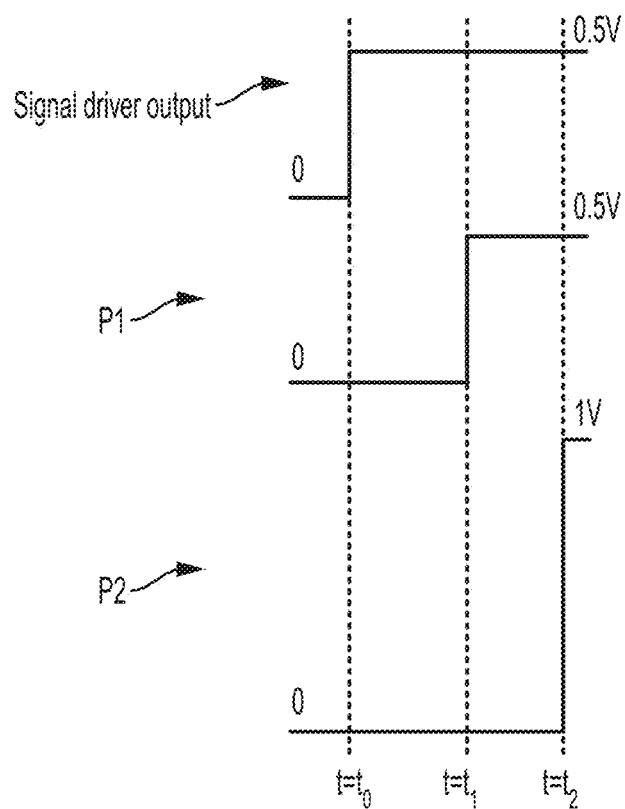
FIG. 2B is a plot illustrating how a signal transition output by the signal driver of FIG. 2A propagates along the electrical line, according to some non-limiting embodiments.

FIG. 2B is a plot illustrating how a signal output by signal driver 202 onto the electrical line 203 may travel along the electrical line. In this example, the signal driver 202 outputs a signal transition at $t=t_0$. In this example, it will be assumed, for the sake of illustration, that the signal driver is configured to output transitions from 0 to 1V (referred to as the "desired transition"), and it will be further assumed that the output impedance of the signal driver, the characteristic impedance of the electrical line and the input impedance of the load are all 50Ω. In this case, the transition actually output at $t=t_0$ has an amplitude that is half (0 to 0.5V) of the desired transition. It should be appreciated that, if the impedances were unmatched, the amplitude of the actual transition would not be half of the desired amplitude transition.

At time $t=t_1$, the 0-0.5V transition has traveled to location P1 along the electrical line 203, where location P1 is between signal driver 202 and defect 204. At time $t=t_2$, the transition reaches defect 204 (an open circuit in this case) at location P2. When the transition reaches the defect, the amplitude of the transition increases to the amplitude (0-1V) that the signal driver is configured to output. This is because a signal actually reaches its intended voltage only when a reflection arises. In a hypothetical scenario in which no reflections arise (such as in infinitely long defect-free cables), the amplitude of the transition would never reach the intended value.

Figure 2C:
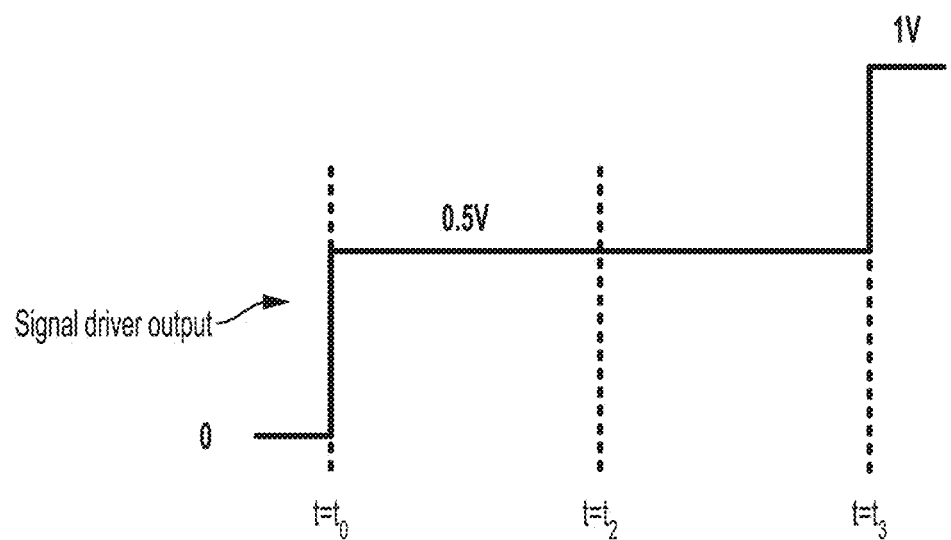
FIG. 2C illustrates an example of a signal driver output in the presence of an open circuit in an electrical line, according to some non-limiting embodiments.

The reflection at location P2 may occur because defect 204 gives rise to a discontinuity in the impedance of the electrical line. The reflected transition may then travel back towards the signal driver 202, and may eventually reach the signal driver. This scenario is illustrated in FIG. 2C, a plot illustrating the output of signal driver 202, also referred to herein as a "TDR signal." The defect is an open circuit in this case. As described above, the first transition (0-0.5V) occurs at $t=t_0$. At $t=t_2$, the transition reaches circuit discontinuity, and a reflection arises. However, nothing happens in the output of the signal driver at this time. At time $t=t_3$, the reflection reaches the signal driver, and as a result, a second transition (0.5V-1V) arises in the output of the signal driver.

Figure 2D:
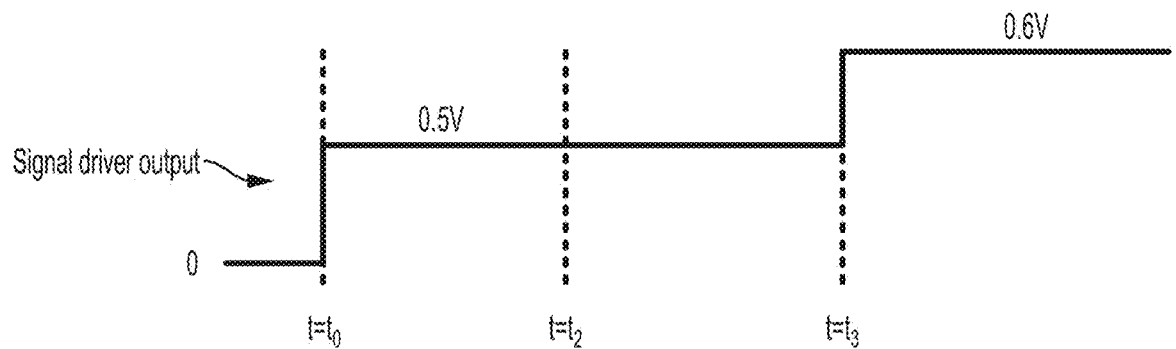
FIG. 2D illustrates an example of a signal driver output in the presence of a defect having finite impedance greater than the electrical line's characteristic impedance, according to some non-limiting embodiments.

FIG. 2D illustrates an example in which the defect causes the impedance of the line to raise above the line's characteristic impedance. If, by way of example, the characteristic impedance is 50Ω, the defect may raise the impedance to more than 50Ω, such as 70Ω or 80Ω. As illustrated, at $t=t_3$, the reflection from the defect reaches the signal driver. Unlike the case in which the defect is an open circuit, however, the second transition reaches only 0.7V, instead of 1V. This is due to the fact that the defect has a finite impedance.

Figure 2E:
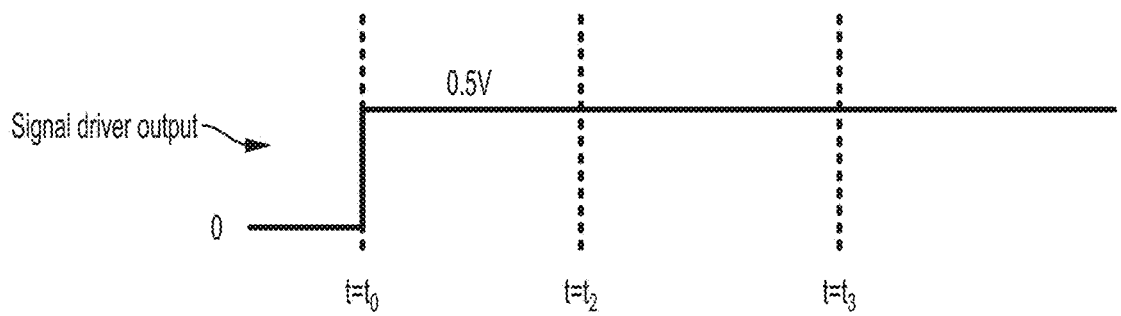
FIG. 2E illustrates an example of a signal driver output in the absence of defects in the electrical line, according to some non-limiting embodiments.

FIG. 2E illustrates an example in which there are no defects along the line. As a result, no reflections occur and the signal remains at 0.5V, even after $t=t_3$.

Figure 2F:
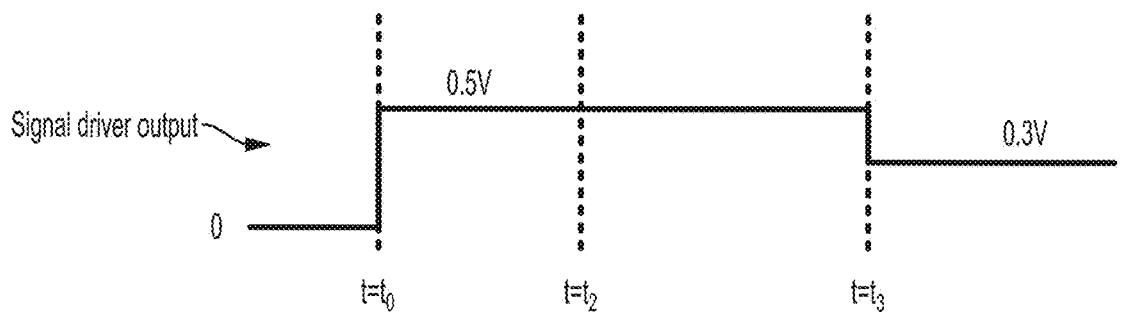
FIG. 2F illustrates an example of a signal driver output in the presence of a defect having finite impedance less than the electrical line's characteristic impedance, according to some non-limiting embodiments.

FIG. 2F illustrates an example in which the defect causes the impedance of the line to decrease below the line's characteristic impedance. If, by way of example, the characteristic impedance is 50Ω, the defect may decrease the impedance to less than 50Ω, such as 20Ω or 30Ω. As illustrated, at $t=t_3$, the reflection from the defect reaches the signal driver. Because the impedance is less than the characteristic impedance, the amplitude of the signal after $t=t_3$ is less than 0.5V (0.3V in this example).

Figure 2G:
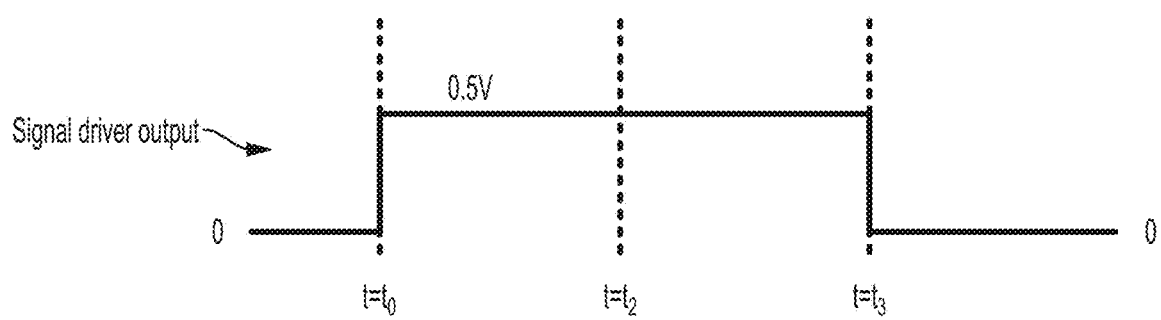
FIG. 2G illustrates an example of a signal driver output in the presence of a short circuit in an electrical line, according to some non-limiting embodiments.

FIG. 2G illustrates an example in which the defect causes a short circuit along the line. This case may occur, for example, if the line is unintentionally coupled to a ground plane. In this case, the impedance is zero, and at $t=t_3$, the signal returns to zero.

Some embodiments are configured to determine the location of defect 204 based on the time it takes the reflected waveform to travel back to the signal driver. For example, some embodiments are configured to determine the location of defect 204 by determining the duration of the time interval $\Delta t = t_3 - t_0$. In some embodiments, the distance $\Delta x$ of the defect from the signal driver may be determined by computing $\Delta x = v \Delta t$, where v is the velocity of electrical signals traveling along the electrical path. Velocity v may be measured using different techniques known in the art. Additionally, or alternatively, some embodiments are configured to determine (e.g., measure or estimate) the impedance of the line including the defect or the impedance of the defect itself. The value of the impedance may inform a user whether a replacement part is desirable or not. If, for example, the defect causes the impedance to deviate from the expected value by 5% (or another threshold value) or less, the user may conclude that replacing the part is not necessary. If, on the other hand, the defect causes the impedance to rise or fall by more than 5%, the user may conclude that replacing the part may be desirable.

Figure 3:
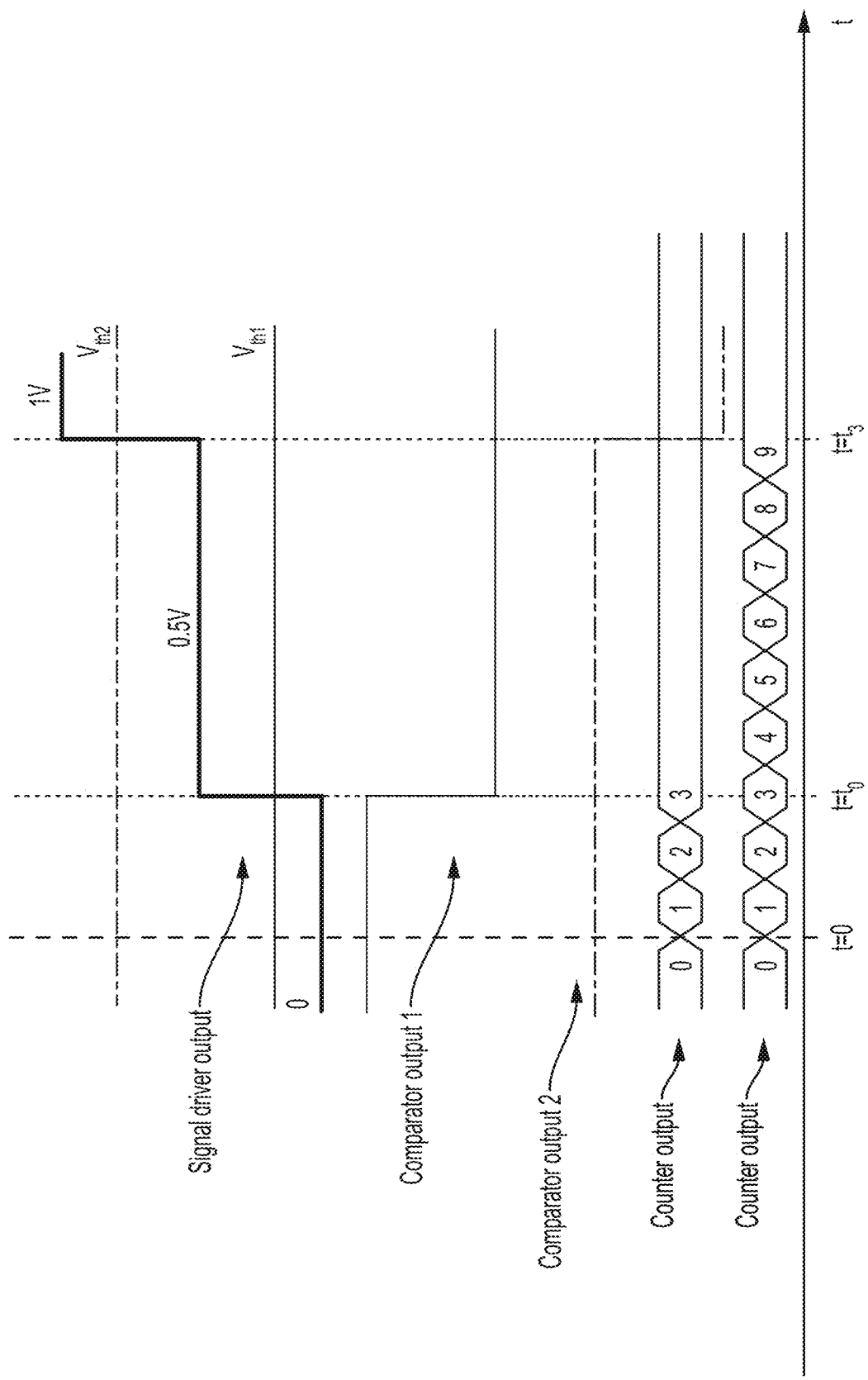
FIG. 3 is a plot illustrating schematically a technique for determining the location of a defect along an electrical line based on the identification of two events, according to some non-limiting embodiments.

FIG. 3 is a plot illustrating a method for determining the location of a defect, according to some non-limiting embodiments. The plot illustrates the output of signal driver 202. As described above, the output of the signal driver includes a first transition occurring at $t=t_0$ and a second transition, resulting from the reflection of the first transition from the defect 204, occurring at $t=t_3$. The location of the defect may be inferred by determining the occurrence of two events. The first event occurs when the first signal transition crosses (e.g., exceeds as in this case, or in other cases, falls under) threshold $V_{th1}$; the second event occurs when the second transition crosses threshold $V_{th2}$. In this specific example, $V_{th1}=0.2V$ and $V_{th2}=0.8V$; however, any other suitable values for the thresholds may be used.

These events may trigger a circuit configured to measure the duration of this time interval. For example, the occurrence of the first event may trigger the output of a comparator to toggle from one value to another (see comparator output 1); the occurrence of the second event may trigger the output of a comparator to toggle from one value to another (see comparator output 2). The location of the defect may be determined based on the duration of the interval between the time when comparator output 1 toggles and the time when comparator output 2 toggles. This may be accomplished, at least in some embodiments, by counting clock cycles. It should be appreciated that while the method described herein used two separate comparators for determining when the signal transitions cross the respective thresholds, in other embodiments a single comparator may be used. The single comparator may, for example, initially receive the first threshold as a first input and subsequently the second threshold as the first input. The signal driver's output may be provided to the comparator's second input. Of course, other methods for measuring the duration of time intervals may be used. In some embodiments, a counter may count clock cycles, and a control circuit may be configured to determine at which clock counts the first and second event occur. In this example, the control circuit may determine that the first event occurs at clock cycle 3, and the second event occurs at clock cycle 9. In some embodiments, the location of the defect may be computed using the following expression: $\Delta x = v \Delta t = vP(\text{count}_2 - \text{count}_1)$, where v is the velocity of the waveform, P is the periodicity of the clock, $\text{count}_1$ (3 in this case) is the clock count at the occurrence of the first event and $\text{count}_2$ (9 in this case) is the clock count at the occurrence of the second event.

III. Non-Digitizing Circuits for Time-Domain Reflectometry

Figure 4:
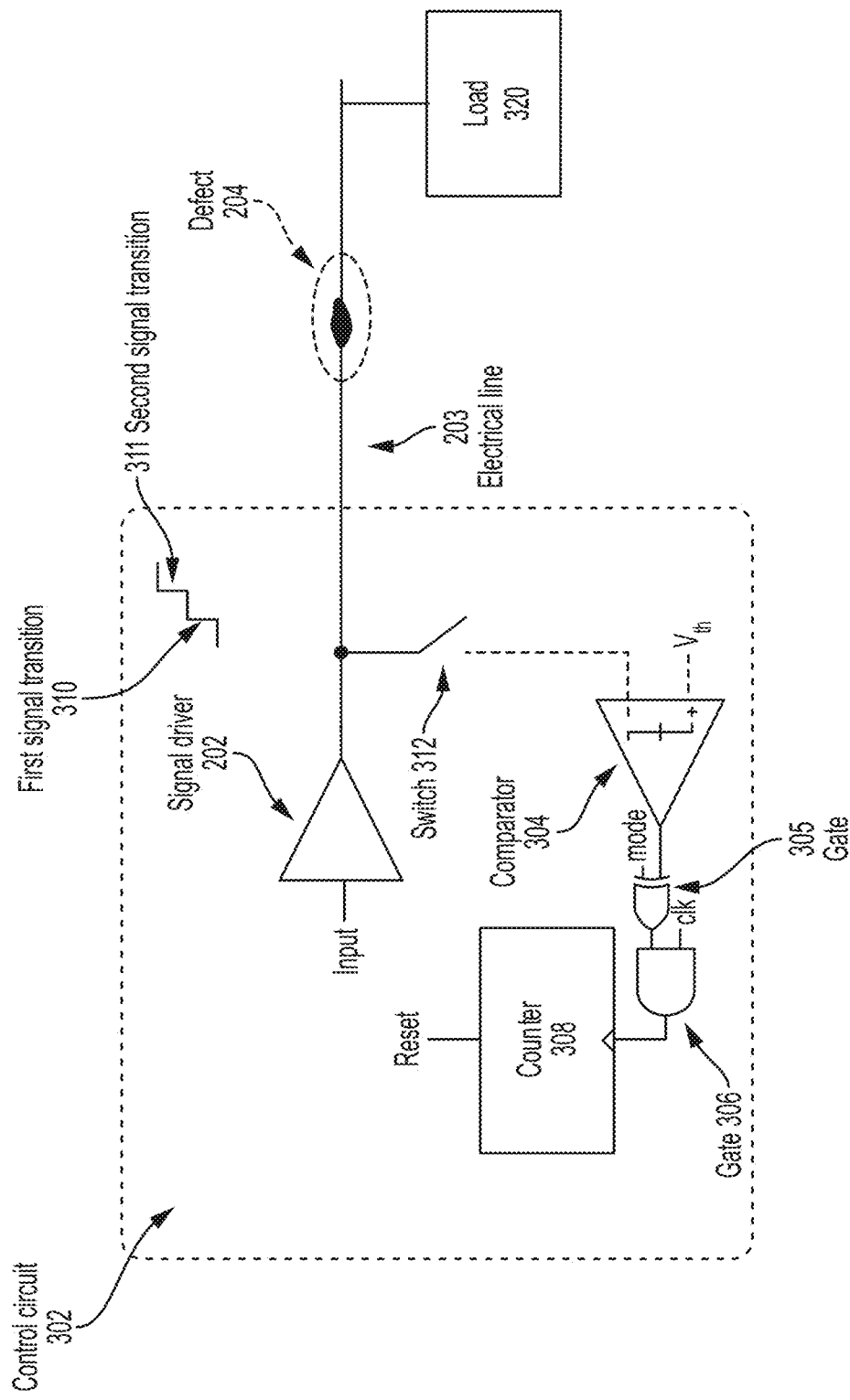
FIG. 4 is a circuit diagram illustrating an example of a control circuit implementing the technique illustrated in FIG. 3, according to some non-limiting embodiments.

An example of a system for implementing the methods described in connection with FIG. 3 is illustrated in FIG. 4, according to some non-limiting embodiments. Control circuit 302 may be connected to load 320 via electrical line 203. As in the previous examples, electrical line 203 includes a defect 204. Control circuit 302 may be configured to determine the location of defect 204 along the electrical line. In some embodiments, control circuit 302 may further include a digital processor and a memory unit (not illustrated in FIG. 4)

Switch 312 may be closed in the TDR mode, and may be open in the normal mode. In the TDR mode, TDR measurements of the types described herein may be performed. In the normal mode, signal driver 202 may transfer/receive data to/from the load 320. For example, signal "input" may be transmitted to the load 320.

Control circuit 302 may further include comparator 304, gates 305 and 306 and counter 308. In this example, a single comparator is used to compare the first signal transition to the first threshold and the second signal transition to the second threshold. As described above, however, separate comparators may be used to perform the two comparisons. The comparator's input labelled "$V_{th}$" receives the threshold. A control circuit coupled to the $V_{th}$ comparator's input may be configured to set the value of the threshold. For example, the control circuit may first set $V_{th}$ to $V_{th1}$, and after a certain period of time has lapsed, may set $V_{th}$ to $V_{th2}$. The time at which $V_{th}$ may be set to $V_{th2}$ may be so that, when the second signal transition is received, this transition is compared to $V_{th2}$, and not $V_{th1}$. Of course, the control circuit may not know a priori when the second signal transition will arrive, thus making it difficult to estimate when to set $V_{th}$ to $V_{th2}$. Nonetheless, this challenge may be overcome, for example, by setting $V_{th}$ to $V_{th2}$ after (e.g., after 1 clock cycle, after 2 clock cycles, after 3 clock cycles, etc.) having determined that the first signal transition has crosses the first threshold.

The output of comparator 304 may toggle when a first signal transition 310 crosses $V_{th1}$ (referred to as the first event), and when a second signal transition 311 crosses $V_{th2}$ (referred to as the second event). For example, the output of the comparator may enable gate 306 between the first event and the second event, so that the counter increases its clock cycle count only between the first event and the second event. While gate 306 is an AND gate in this example, other logic gates may be used to control the operations of the counter. In another example, the counter 308 may start counting clock cycles at an arbitrary point in time (e.g., at t=0, as shown in FIG. 3). When the first signal transition crosses the first threshold, a control circuit (not shown in FIG. 4) coupled to the counter 308 may determine at which clock cycle count this first event has occurred. Subsequently, when the second signal transition crosses the second threshold, the control circuit may determine at which clock cycle count this second event has occurred. The duration of the interval between the first and second event may then be determined based on these counts. For example, the duration of the interval may be determined by computing the difference between the count at the second event and the count at the first event, multiplied by the period of the clock.

Gate 305 (an XOR gate in this example) may be used to set the mode of operation. In some embodiments, for example, two modes of operation may be possible for the circuits described herein (of course, more than two modes are also possible in other embodiments). One mode of operation may be aimed at determining the location of defects whose impedance is greater than the expected value (as in the case described in connection with FIG. 3), and optionally at determining the value of the impedance. This mode is referred to as the "high-impedance mode." Another mode of operation may be aimed at determining the location of defects whose impedance is less than the expected value, and optionally at determining the value of the impedance. This mode is referred to as the "low-impedance mode."

Because it may not be known a priori whether a defect has an impedance greater or less than the expected value, in some embodiments, the circuit may first be operated in one mode and then in the other mode. In this example, when the "mode" control signal is equal to 0, the circuit operates in the high-impedance mode. Vice versa, when mode=1, the circuit operates in the low-impedance mode. In the high-impedance mode, the counter 308 may count clock cycles if gate 306 is active (e.g., outputs a 1). In the low-impedance mode, the counter 308 may count clock cycles if gate 306 is inactive (e.g., outputs a 0). Examples of different modes of operation are described in section IV of the present disclosure.

Figure 5A:
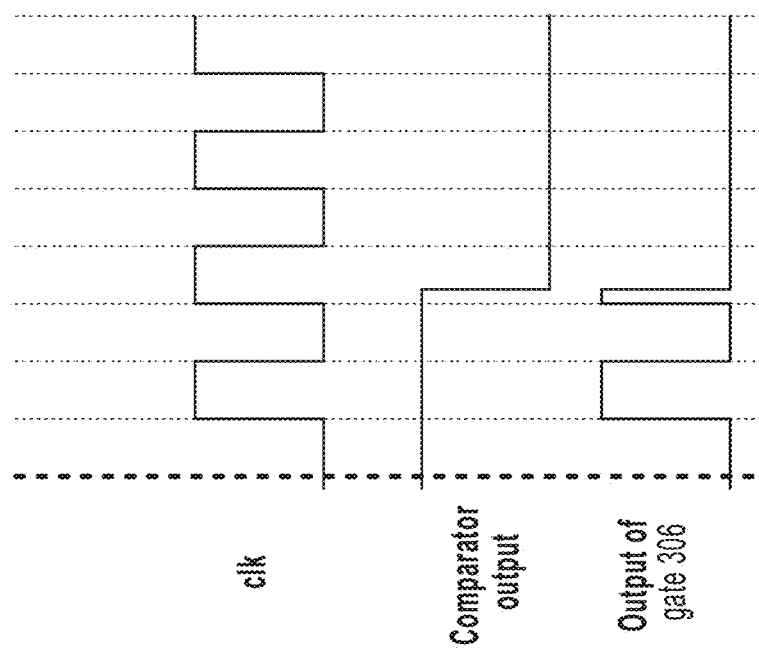
FIG. 5A is a plot illustrating the output of a gate in the presence of glitches, according to some non-limiting embodiments.

In some embodiments, control circuit 302 may suffer from glitches. Glitches may arise due to the fact that the signal transitions may occur asynchronously relative to the edges of the clock. As a result, the glitch may erroneously cause an increase in the count of the counter 308. This scenario is illustrated in FIG. 5A. As shown, the comparator output toggles in response to a crossing event asynchronously relative to the occurrence of a clock edge. This may erroneously enable gate 306 for a short period of time, which in turn may cause the counter 308 to erroneously increase its count.

Figure 5B:
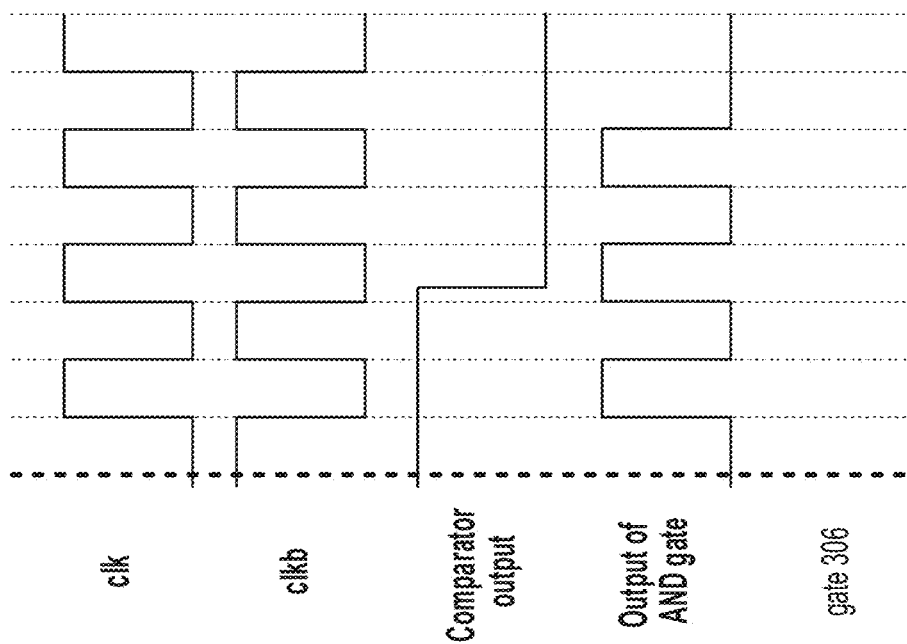
FIG. 5B is a plot illustrating the output of a gate in which glitches have been removed, according to some non-limiting embodiments.
Figure 5C:
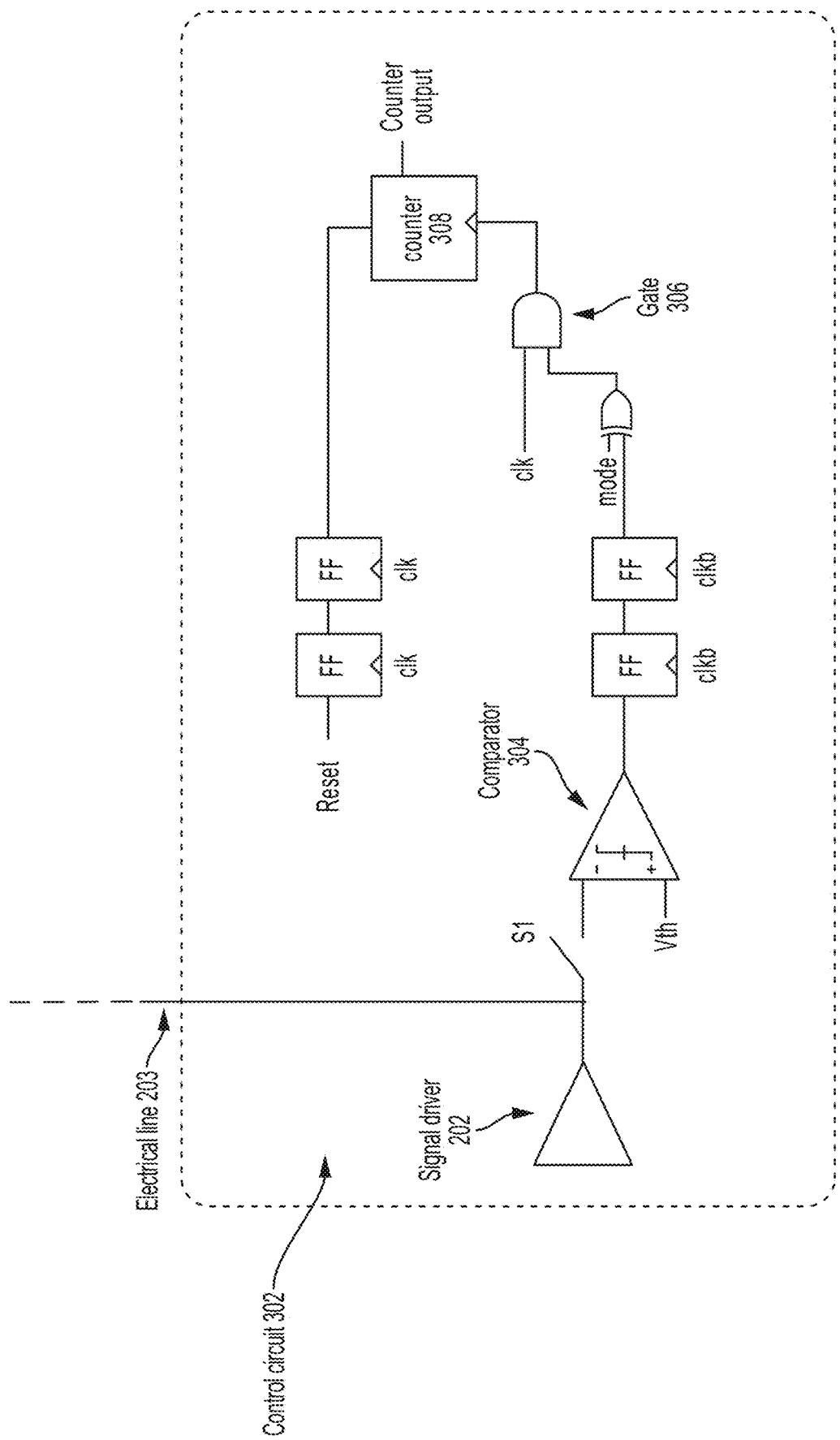
FIG. 5C is a circuit diagram illustrating another example of a control circuit implementing the technique illustrated in FIG. 3, according to some non-limiting embodiments.

In some embodiments, this problem may be obviated using one or more flip-flops, as illustrated in FIG. 5C, according to some non-limiting embodiments. As shown, a pair of flip-flops (FF) are inserted between comparator 304 and gate 306. The flip-flops may be triggered by clkb, the inverse of clk. FIG. 5B is a plot illustrating the output of gate 306 when flip-flops are used as shown in FIG. 5C. In this case, even though the crossing event does not occur synchronously relative to a clock edge, the output of the gate 306 does not toggle until an edge of clkb is received. As a result, the formation of glitches is prevented. While FIG. 5C illustrates two flip-flops between the comparator 304 and gate 306, any other suitable number of flip-flops may be used. Flip-flop(s) may additionally, or alternatively, be used for the reset signal.

In some embodiments, IC 104 may include a control circuit 302 for each (or at least some) of the electrical lines to which the IC is connected. In this way, multiple TDR measurements may be performed in parallel.

IV. Modes of Operation

As described above, some of the circuits described herein may be operated in two different modes: the high-impedance mode or the low-impedance mode. In the high-impedance mode, a circuit may be arranged to determine the location, and optionally the value of the impedance, of defects whose impedance is greater than the expected value (e.g., the characteristic impedance of the electrical line). FIG. 3 is an example of operations in the high-impedance mode. Additional examples are described below. In some embodiments, two separate modes may be warranted by the fact it may be desirable to set the thresholds differently depending on whether the impedance of the defect is above or below the expected value.

a. High-Impedance Mode

Figure 6A:
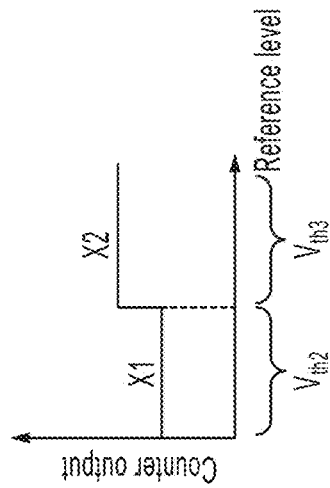
FIG. 6A is a plot illustrating a signal driver output in the presence of an open circuit, according to some non-limiting embodiments.
Figure 6B:
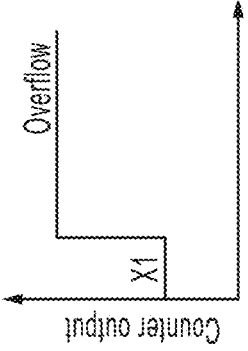
FIG. 6B is a plot illustrating the output of a counter when the signal driver output of FIG. 6A is produced, according to some non-limiting embodiments.
Figure 6C:
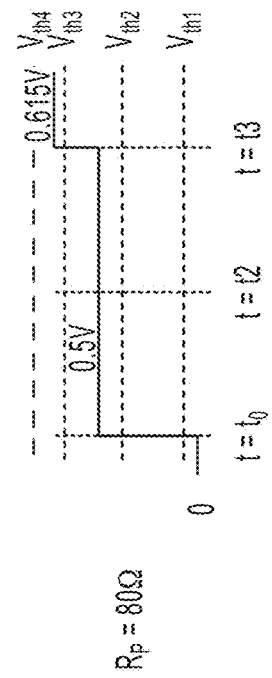
FIG. 6C is a plot illustrating a signal driver output in the presence of a defect having a 80Ω impedance, according to some non-limiting embodiments.
Figure 6D:
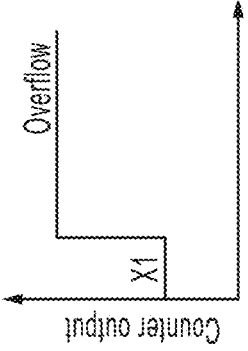
FIG. 6D is a plot illustrating the output of a counter when the signal driver output of FIG. 6C is produced, according to some non-limiting embodiments.
Figure 6E:
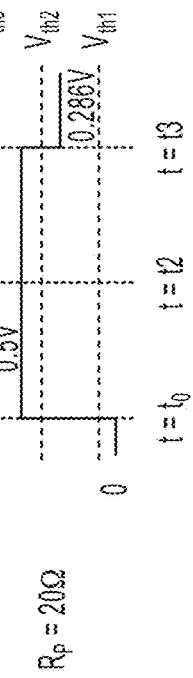
FIG. 6E is a plot illustrating a signal driver output in the presence of a defect having a 20Ω impedance, according to some non-limiting embodiments.
Figure 6F:
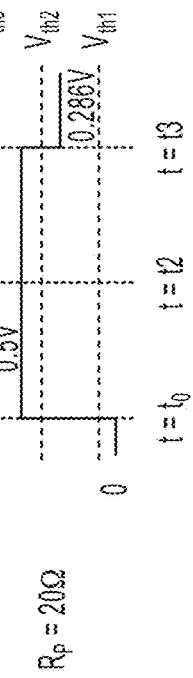
FIG. 6F is a plot illustrating the output of a counter when the signal driver output of FIG. 6E is produced, according to some non-limiting embodiments.
Figure 6G:
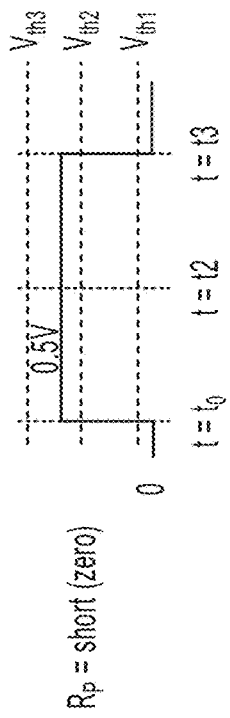
FIG. 6G is a plot illustrating a signal driver output in the presence of an short circuit, according to some non-limiting embodiments.
Figure 6H:
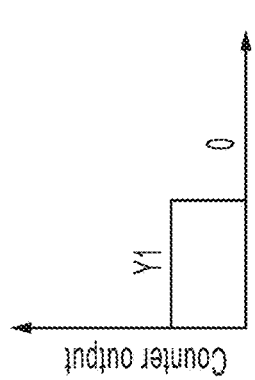
FIG. 6H is a plot illustrating the output of a counter when the signal driver output of FIG. 6G is produced, according to some non-limiting embodiments.

Examples of operation of the methods described herein in the high-impedance mode are illustrated in FIGS. 6A-6F, in accordance with some non-limiting embodiments. Specifically, FIG. 6A illustrates an example in which the defect is an open circuit (infinite resistance); FIG. 6C illustrates an example in which the impedance of the defect is greater than the expected 50Ω-impedance (80Ω in this case); and FIG. 6E illustrates an example in which the impedance of the defect is less that the expected 50Ω-impedance (20Ω in this case). FIG. 6B illustrates the output of the counter expressed in clock cycles in the case of FIG. 6A; FIG. 6D illustrates the output of the counter in the case of FIG. 6C; and FIG. 6F illustrates the output of the counter in the case of FIG. 6E. It should be noted that, while in these examples 50Ω is taken as the expected impedance, other values are also possible as the application is not limited to any specific value.

Referring first to FIGS. 6A-6B, a 0-0.5V transition occurs at $t=t_0$. In this case, it is assumed that the counter has started counting clock cycles at some time $t=0$ prior to $t_0$. The circuit may be arranged such that, when the signal driver output crosses $V_{th2}$, a counter is disabled and the clock cycle count (i.e., the counter output) is registered (e.g., is stored in a memory). In this case, at the time when the signal driver output crosses $V_{th2}$, the counter output is X1 (e.g., 3 clock cycles). FIG. 6B illustrates the output of the counter as a function of the threshold voltage that, when crossed, triggers the counter to be disabled. Subsequently, when the signal driver output crosses $V_{th3}$, a counter (the same counter or another counter) is disabled. At the time the signal crosses $V_{th3}$, the counter output is X2. As discussed in connection with FIG. 3, the location of the open circuit can be determined based on X2-X1.

Referring now to FIGS. 6C-6D, in which the defect has a 80Ω-impedance, a 0-0.5V transition occurs at $t=t_0$. When the signal crosses $V_{th2}$, a counter is disabled and the counter output is X1. Subsequently, when the signal crosses $V_{th3}$, a counter is disabled and the counter output is X2. As in the previous case, the location of the defect may be inferred based on X2-X1. It should be noted that, unlike the previous case, the voltage of the signal after $t_3$ is less than 1V (0.615V is this example). The reason for a voltage less than 1V is that the impedance of the defect is finite. In fact, the voltage of the signal after $t_3$ depends on the impedance of the defect. An infinite impedance leads to a 1V voltage. By contrast, a 50Ω impedance leads to 0.5V. Any value in between produces a voltage between 0.5V and 1V.

The inventors have appreciated that the value of the impedance arising due to the defect may be determined by determining the amplitude of the signal driver output upon being reflected at the defect. In the example of FIG. 6C, an additional threshold—$V_{th4}$—is introduced. Let's assume, by way of example, that $V_{th4}$ is set to 0.7V and that $V_{th3}$ is set to 0.6V. Since the signal never crosses $V_{th4}$, the counter is never disabled and continues to count. At some point, however, the counter reaches its maximum value. For example, a 10-bit counter reaches its maximum when the counter has counted 1024 clock cycles. When a counter reaches it maximum, it is said to have overflown.

Because the counter has overflown as a result of setting $V_{th4}$ to 0.7V, it can be inferred that the signal is less than 0.7V. At the same time, it can also be inferred that the signal is greater than $V_{th3}$=0.6V, since the crossing of that threshold triggered the counter to output X2. As a result, it can be inferred that the signal, after $t_3$, is between 0.6V and 0.7V, and a result, that the impedance of the defect is between 75Ω and 116Ω. It should be appreciated that the resolution with which the value of the impedance is determined may be increased by increasing the number of thresholds. In one example, ten different thresholds may be introduced between 0 and 1V with 0.1V steps.

The example of FIGS. 6E-6F illustrates why the high-impedance mode may not be suitable for defects with impedance less than 50Ω (or other expected values of impedance). In this case, the impedance of the defect is 20Ω. As in the previous cases, a counter outputs X1 when the signal crosses $V_{th2}$. $V_{th3}$, however, is never crossed because the signal falls below 0.5V at $t=t_3$ (0.286V is this case). As a result, the counter overflows when it reaches its maximum. Accordingly, a second counter output is never generated and the location of the defect may not be determined.

b. Low-Impedance Mode

In order to determine the location of defects whose impedance is less than the expected impedance, and optionally to determine the value of the impedance, the logic of the counter may be inverted. This may be accomplished, for example, by setting the mode input of the gate 305 to 1. Unlike in the high-impedance mode, in which the counter is enabled prior to the beginning of the measurement, in the low-impedance mode the counter is enabled by a specific event, such as a signal driver output crossing a predefined threshold. Examples of operation in the low-impedance mode are illustrated in FIGS. 6G-6L, in accordance with some non-limiting embodiments. In particular, FIGS. 6G-6H refer to a case in which the defect is a short circuit (zero impedance).

Prior to $t=t_0$, the counter is disabled. When the signal crosses $V_{th1}$, the counter is enabled and as a result starts counting clock cycles. At $t=t_3$, the signal returns to zero since the connection is shorted. As the signal crosses $V_{th2}$, the counter is disabled and as a result stops counting. The output of the counter, Y1 in this case, is indicative of the time passed between $t_0$ and $t_3$, as a result, of the location of the shorted connection. In essence, in the low-impedance mode, the counter may be viewed as being configured to measure the width of the signal pulse.

Figure 6I:
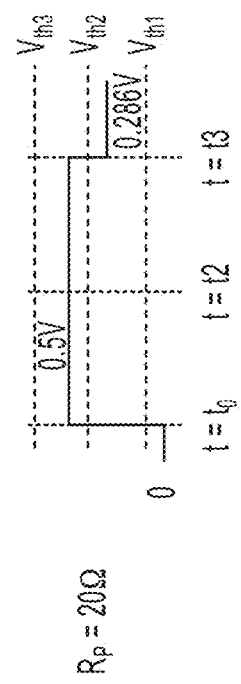
FIG. 6I is a plot illustrating another signal driver output in the presence of a defect having a 20Ω impedance, according to some non-limiting embodiments.
Figure 6J:
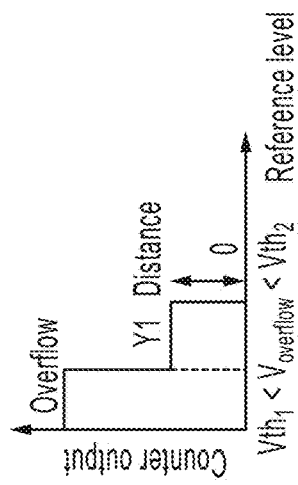
FIG. 6J is a plot illustrating the output of a counter when the signal driver output of FIG. 6I is produced, according to some non-limiting embodiments.

In the example of FIGS. 6I-6J, the impedance of the defect is 20Ω. As in the previous case, a counter is activated when the signal crosses $V_{th1}$. A counter is then deactivated when the signal crosses $V_{th2}$, thus producing Y1. Another counter is configured to be deactivated by the signal falling below $V_{th1}$. However, $V_{th1}$ is never crossed. Assuming for example, that the signal is 0.285V and that $V_{th1}$ is set to 0.25V, the signal never falls below the threshold. As a result, the counter overflows. Accordingly, it may be inferred that the signal, after $t_3$, is between $V_{th2}$ (e.g., 0.3V) and $V_{th1}$=0.25V, and that the impedance is between 21.4Ω and 16.7Ω.

Figure 6K:
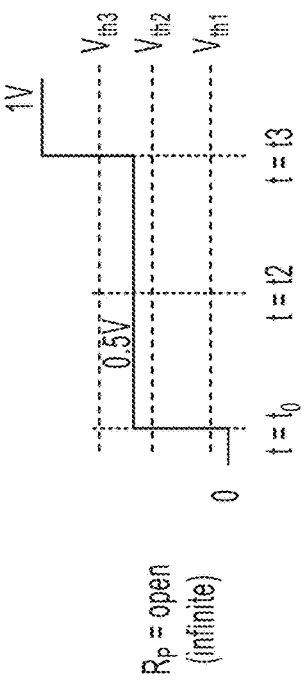
FIG. 6K is a plot illustrating a signal driver output in the presence of an open circuit, according to some non-limiting embodiments.
Figure 6L:
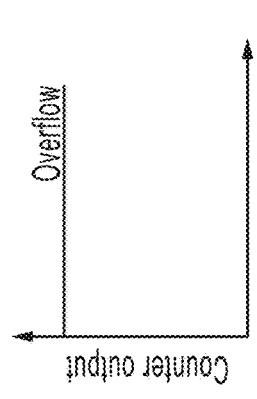
FIG. 6L is a plot illustrating the output of a counter when the signal driver output of FIG. 6K is produced, according to some non-limiting embodiments.

The example of FIGS. 6K-6L illustrates why the low-impedance mode may not be suitable for defects with impedance greater than 50Ω (or other expected values of impedance). In this case, the impedance of the defect is infinite (open circuit). As in the previous cases, the counter is enabled when the signal crosses $V_{th1}$. However, the signal never crosses $V_{th2}$, and as a result the counter overflows, thus providing no useful information.

V. Iterative Methods for Non-Digitizing Time-Domain Reflectometry

The example of FIG. 3 illustrates a case in which the first and second transitions have the same amplitude (0.5V). This may occur because the output impedance of the signal driver matches the characteristic impedance of the electrical line and the input impedance of the load. In this case, setting the thresholds to 0.2V and 0.8V, respectively, would ensure proper operation of the methods and circuits describe above. In other circumstances, however, the impedances may be unmatched. This may result in the first and second signal transitions having different amplitudes. Unfortunately, due to the unpredictable nature of the impedance values, the extent to which the amplitude of the first signal transition differs from the amplitude of the second transition may not be known a priori. As a result, it may be difficult to set threshold values that are suitable for all situations.

Figure 7A:
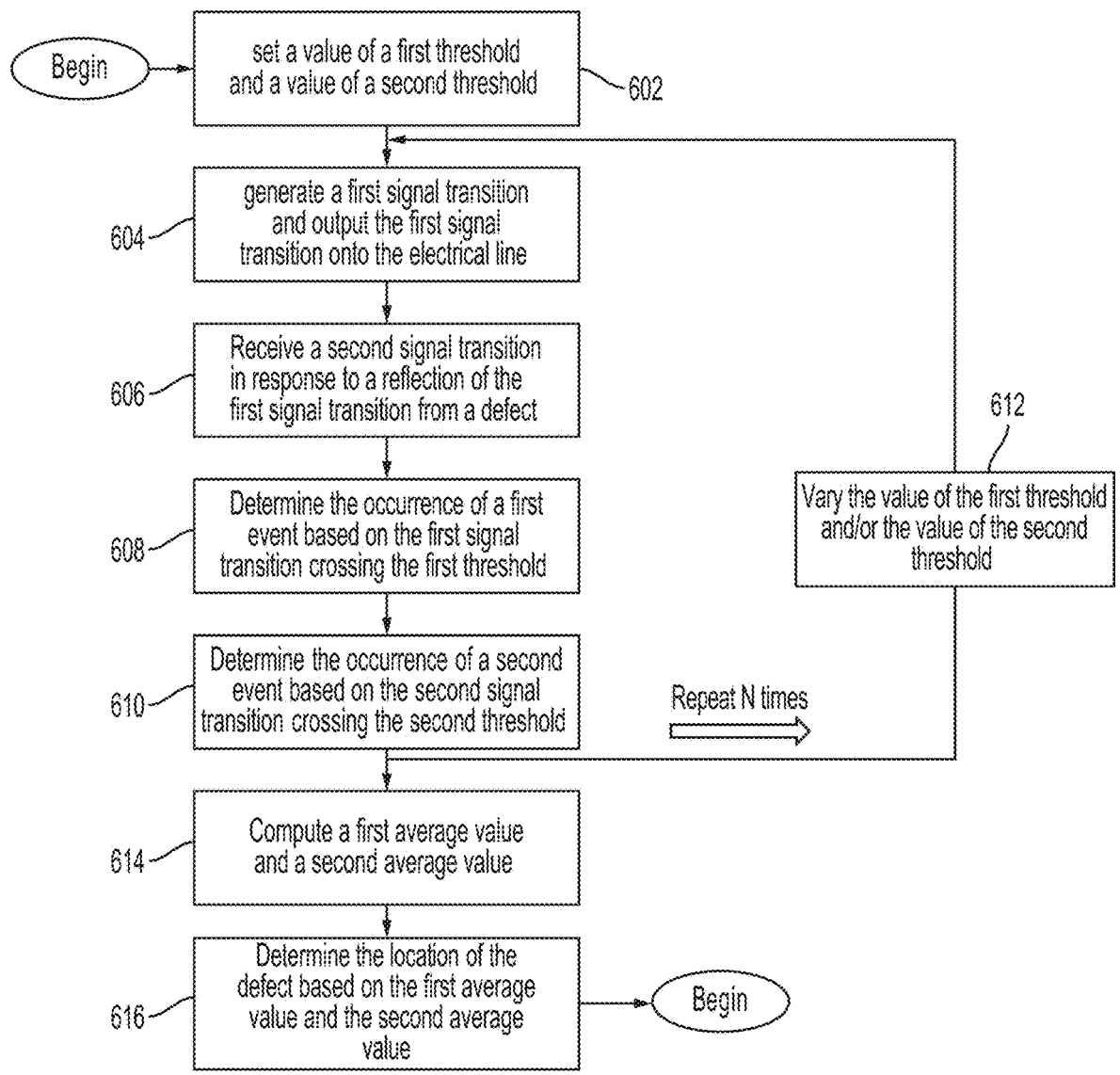
FIG. 7A is a flowchart illustrating a representative method for determining the location of a defect along an electrical line, according to some non-limiting embodiments.
Figure 7B:
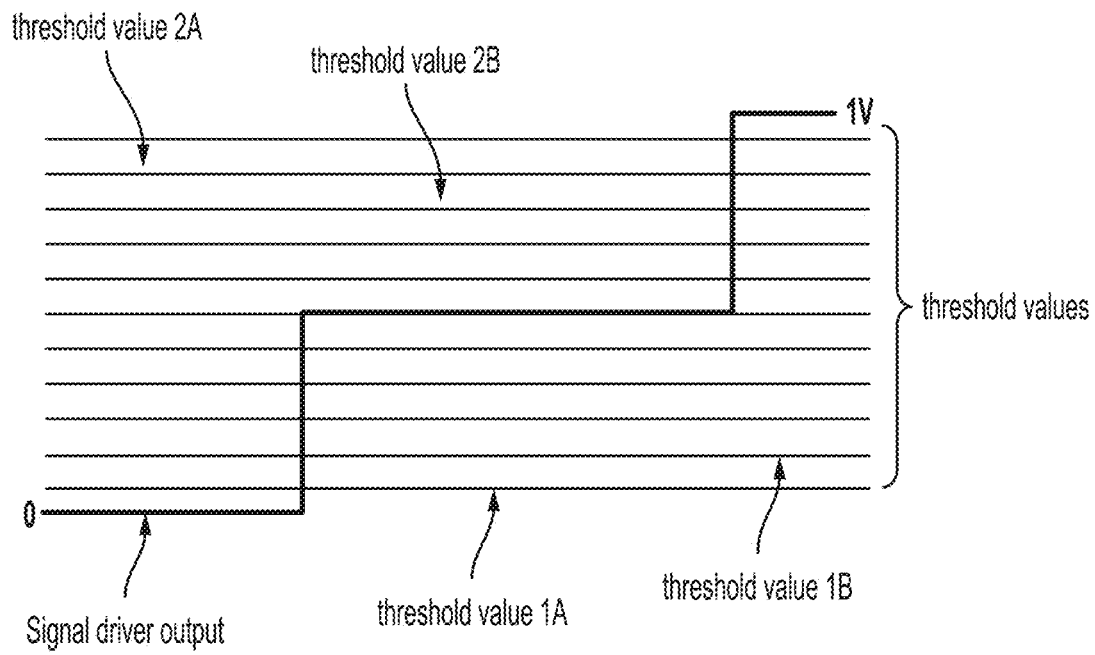
FIG. 7B is a plot illustrating a representative signal driver output and a plurality of threshold values, according to some non-limiting embodiments.
Figure 7C:
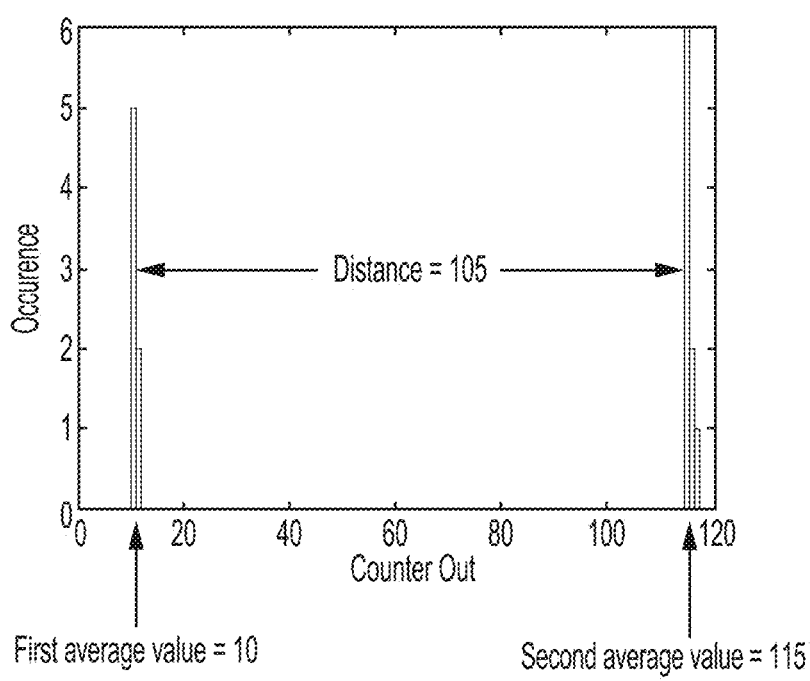
FIG. 7C is a histogram illustrating the occurrences of crossing events, according to some non-limiting embodiments.

To obviate this problem, an iterative TDR method may be used, in which the value of the thresholds is varied over time, and in which the location of the defect is determined statistically. This method is illustrated in FIGS. 7A-7C. Method 600 (FIG. 7A) may begin at act 602, in which the first threshold is set to a certain value and the second threshold is set to another value. As shown in FIG. 7B, the first threshold may be initially set to value 1A, and the second threshold to value 2A. While the method is described in connection with a circuit operating in the high-impedance mode, it should be appreciated that a similar method may be used in the low-impedance mode.

At act 604, a first signal transition (e.g., signal transition 310, FIG. 4) may be generated and output onto the electrical line to be monitored. At act 606, a second signal transition (e.g., signal transition 311, FIG. 4) may be received in response to the first signal transition reflecting against the defect along the electrical line. At act 608, the occurrence of a first event may be determined based on the first signal transition crossing the first threshold. At act 610, the occurrence of a second event may be determined based on the second signal transition crossing the second threshold. At act 612, the value of the first threshold and/or the value of the second threshold may be varied. For example, as shown in FIG. 7B, the first threshold may be set to value 1B and the second threshold to value 2B. Acts 604-612 may then be repeated N times, where N>0. In some embodiments, the values of both thresholds are varied at the same iteration. In other embodiments, only the value of a threshold is varied during an iteration, and the value of the other threshold may be separately varied during a subsequent iteration.

FIG. 7C is a histogram illustrating, in the high-impedance mode, the occurrences of the first events (first signal transitions crossing the first threshold) and the occurrences of the second events (second signal transitions crossing the second threshold) where the first and second thresholds are varied as shown in FIG. 7B. The histogram is plotted as a function of time expressed in clock cycles.

At act 614, a first representative measurement value (e.g., a majority vote, or an average value) may be computed based on the occurrences of the first crossing events and a second representative measurement value may be computed based on the occurrences of the second crossing events. These representative measurement values may represent the average clock counts at the time when crossing events occur. For example, the representative measurement values may be computed by computing the majority votes, or the average values (e.g., the arithmetic mean, the geometric mean, the median, etc.) of the distributions shown in FIG. 7C. The first and second representative measurement values are equal to 10 and 115, respectively, in this example.

At act 616, the location of the defect may be determined based on the first and second representative measurement values. For example, the location of the defect may be determined by computing the difference between the second representative measurement value and the first representative measurement value. As illustrated in FIG. 7C, this difference is equal to 105 clock cycles in this example. The location of the defect may be computed using this expression: $\Delta x = vP(\Delta count)$, where v is the velocity of the waveform, P is the periodicity of the clock, and $\Delta count$ is the difference between the first representative measurement value and the second representative measurement value (105 in this case).

Figure 7D:
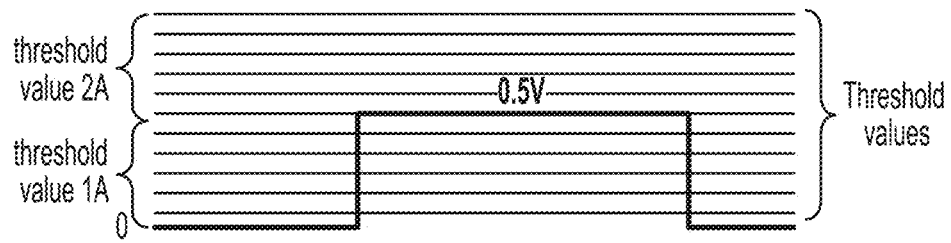
FIG. 7D is a plot illustrating another representative signal driver output and a plurality of threshold values, according to some non-limiting embodiments.
Figure 7E:
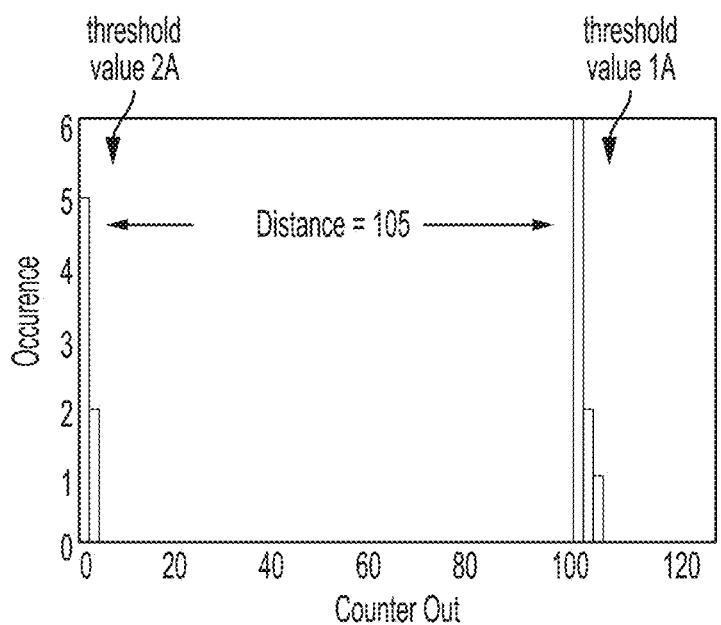
FIG. 7E is another histogram illustrating the occurrences of crossing events, according to some non-limiting embodiments.

FIG. 7D illustrates a representative set of thresholds for use in the low-impedance mode, and FIG. 7E illustrates a correspond histogram. As shown, the histogram illustrates the occurrences of the two consecutive events (signal positively crossing the first threshold and signal negatively crossing the same threshold) and the occurrences of no such event (corresponding to threshold value 2A). Based on the statistics of these events, the location of the defect may be determined (counter overflow is not considered).

VI. Digitizing Methods and Circuits for Time-Domain Reflectometry

The TDR methods described above may be sufficient when a user wishes to determine the location of defects along one or more electrical lines of an electronic system. In other contexts, however, a user may wish to determine, in addition or in alternative to the location, other characteristics of a defect, including for example the electrical impedance of the defect and/or the nature of the defect (such as whether the defect is a short, an open, a poorly soldered connection, an unusually high-resistance pin, etc.).

Figure 8A:
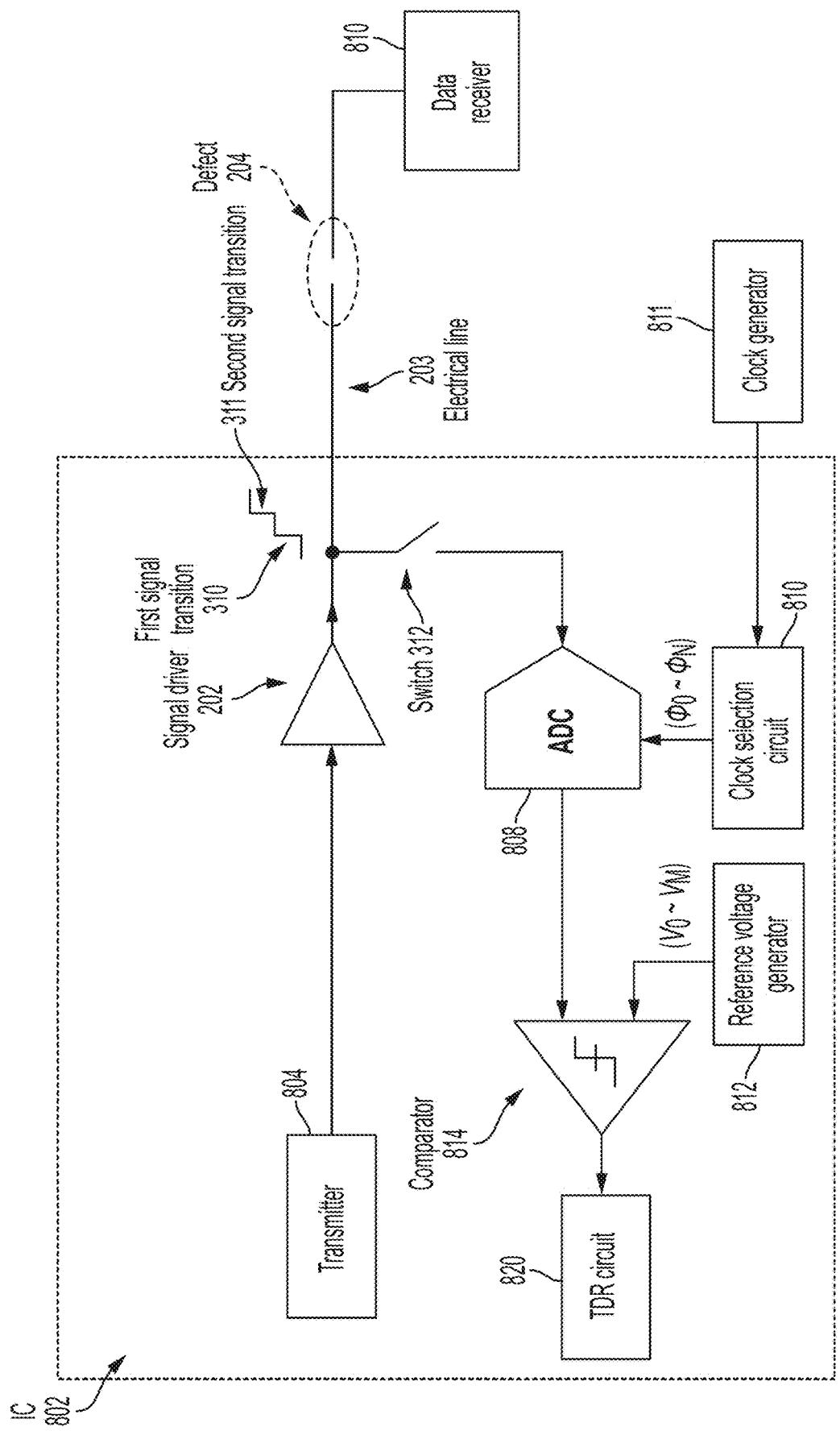
FIG. 8A is a circuit diagram illustrating an example of a control circuit including an analog-to-digital converter, according to some non-limiting embodiments.

The inventors have recognized that, in such contexts, it may be desirable to profile the waveform of the TDR signal, which in turn, may involve sampling and digitizing the TDR signal. A representative circuit for performing time-domain reflectometry in this manner is illustrated in FIG. 8A, in accordance with some embodiments. IC 802 may be designed to operate in at least two modes. In the transmit mode, IC 802 is configured to generate data (for example in the form of bits) representative of information and to transmit the data to a receiver. The data may represent, for example, text information, visual information (e.g., video or image), sound information, location information, numerical information, financial information, etc. In the TDR mode, IC 802 is configured to perform time-domain reflectometry. Accordingly, the same hardware of IC 802 may be used for two purposes—to transmit data to another electronic circuit and to perform time-domain reflectometry—thus enabling testing without major disruptions to the operations of the IC.

IC 802 includes, among other components, a transmitter 804, a signal driver 202, a switch 312, an analog-to-digital converter (ADC) 808, a clock selection circuit 810, a reference voltage generator 812, a comparator 814, and a time-domain reflectometry (TDR) circuit 820. In the transmit mode, transmitter 804 generates data representing information to be transmitted to a receiver. Transmitter 804 can be designed to operate according to any communication protocol, including for example the "56G" standard (operating at 56 Gb/s) and the "112G" standard (operating at 112 Gb/s). Other communication standards are also possible. In some embodiments, transmitter is designed to transmit data at rates in excess of 1 Gb/s. In the transmit mode, switch 312 may be open.

As described above in connection with FIG. 2A, signal driver 202 may include amplifiers, buffers, digital-to-analog converters, or other circuitry for outputting signals onto electrical line 203. Signal driver 202, outputs on electrical line 203 signals received from transmitter 804. Data receiver 810 is position at the opposite end of electrical line 203 relative to signal driver 202. Data receiver 810 can be part of any electronic circuit, and may include amplifiers, filters, analog-to-digital converters, processors, memories, etc.

In the TDR mode, transmitter 804 generates signal transitions for performing time-domain reflectometry. For example, transmitter 804 outputs signal transitions similar to those described above in connection with FIG. 2B. Signal driver 202 outputs a first signal transition 310 onto electrical line 203. When a defect 204 is present on the electrical line, a second signal transition 311 arises in response to reflection of the first signal transition 310 from defect 204. The amplitude of second signal transition 311 may depend, among other factors, on the nature of the defect, as described above in connection with FIGS. 2C-2G.

In the TDR mode, switch 312 is closed. As a result, the signal present on electrical line 203, which includes first transition 310 and second transition 311, is coupled to ADC 808. ADC 808 is configured to sample and digitize the received signal, or at least the portion of the received signal that includes transitions 310 and 311.

In some embodiments, ADC 808 is configured to operate at a relatively low frequency, thereby reducing the complexity of the ADC circuit and reducing power consumption. For example, ADC 808 may sample at a frequency that is less than $1/(t_3-t_0)$ (see FIGS. 2D-2G). Nonetheless, ADC 808 may be controlled to sample the signal with a sufficiency high resolution to profile the portion of the signal in which the transitions takes place. This may be accomplished, in some embodiments, by generating multiple instances of the first signal transition 310 (thereby generating multiple instances of the second signal transition 311), and for each instance, by sampling the signal with a different clock signal. In some embodiments, the clock signals used for sampling the different instances of the signal may be delayed replicas of a master clock signal. The delay between the clock signals may be sufficiently small to enable a high overall sampling resolution.

The timing with which ADC 808 samples the signals is controlled by clock selection circuit 810. Clock selection circuit 810 is configured to select one of a plurality of selectable clock signals. For example, clock section circuit 810 may receive a master clock signal from a clock generator 811, and may output one among a plurality of clock signals $\Phi_0 \ldots \Phi_N$, each of such clock signals having a different delay relative to the master clock signal. For example, clock signal $\Phi_0$ may be obtained by introducing no delay, clock signal $\Phi_1$ may be obtained by delaying the master clock signal by $\delta t$, clock signal $\Phi_2$ may be obtained by delaying the master clock signal by $2\delta t$, and clock signal $\Phi_N$ may be obtained by delaying the master clock signal by $N\delta t$. N is an integer number greater than 1. In some embodiments, delay $\delta t$ is less than $t_3-t_0$.

Thus, clock selection circuit 810 may select one among the following selectable delays: $0, \delta t, 2\delta t \ldots N\delta t$, and output a clock signal based on the selected delay. It should be appreciated that, while in this example the delays are incremented in a linear fashion, not all embodiments are limited in this respect as the delays may be incremented in any other suitable way.

Figure 8B:
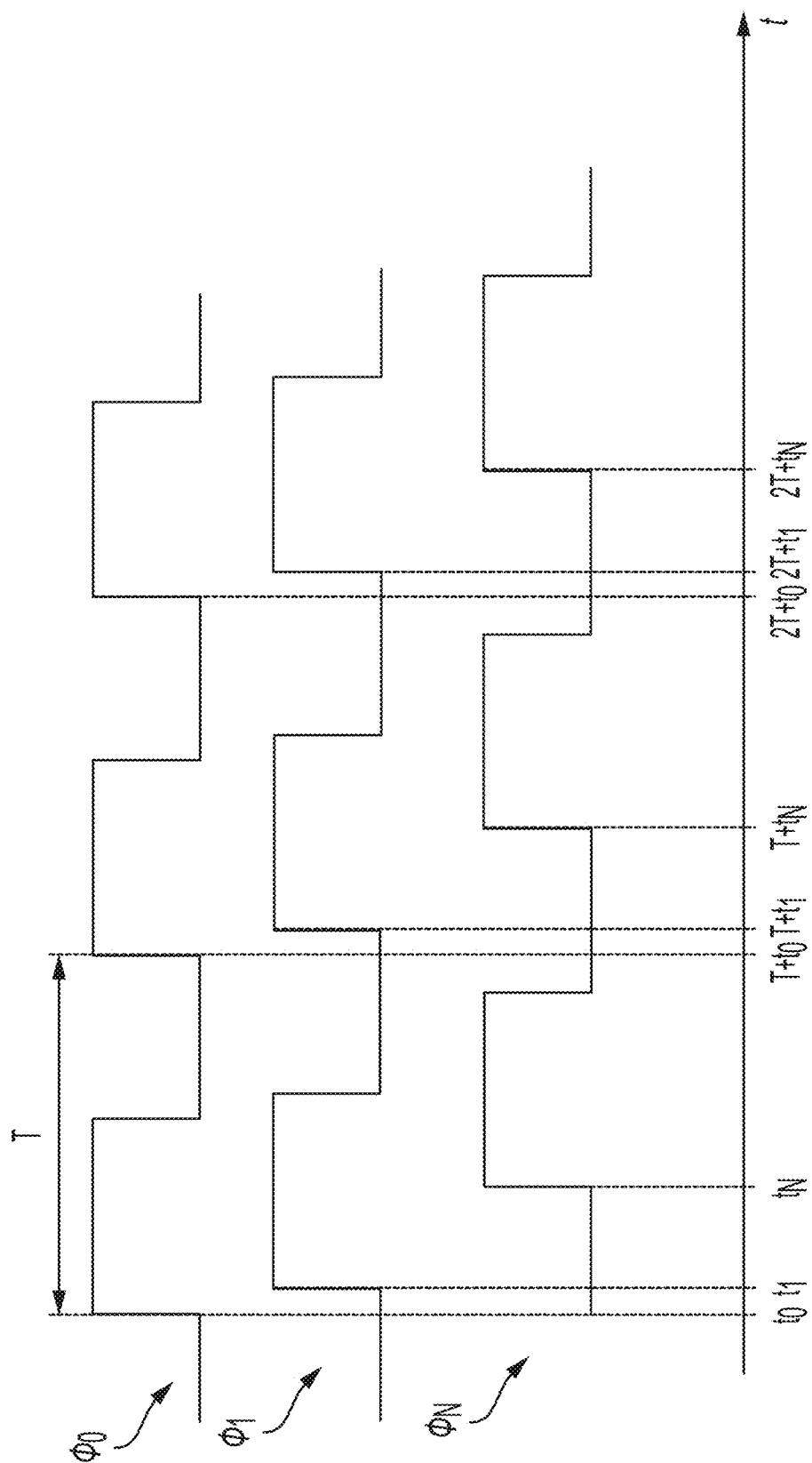
FIG. 8B is a plot illustrating a set of selectable clock signals, according to some non-limiting embodiments

Examples of clock signals that may be output depending on the selected delay are illustrated in FIG. 8B, in accordance with some non-limiting embodiments. Clock signals $\Phi_0, \Phi_1$ and $\Phi_N$ are replicas of the same master clock, but are delayed by different amounts. In this example, the rising edges of clock signal $\Phi_0$ occur at $t=t_0, t=T+t_0, 2T+t_0$, etc. (where T indicates the periodicity of the clock signal), the rising edges of clock signal $\Phi_1$ occur at $t=t_1, t=T+t_1, 2T+t_1$, etc. and the rising edges of clock signal $\Phi_N$ occur at $t=t_N, t=T+t_N, 2T+t_N$, etc.

ADC 808 samples the signal with a timing determined by the selected clock signal (e.g., at the rising edge or the falling edge of the selected clock signal). The output of ADC 808 is a plurality of numerical values representing the voltage of the signal at the time of sampling. For example, when clock signal $\Phi_0$ is selected, ADC 808 produces a first numerical value at $t=t_0$, a second numerical value at $t=T+t_0$, a third numerical value at $t=2T+t_0$, etc.

Comparator 814 compares the numerical values produced by ADC 808 with a reference voltage. The output of comparator 814 is 1 if the output of ADC 808 exceeds the reference voltage, and is 0 otherwise (though the opposite logic may alternatively be used).

Reference voltage generator 812 selects the reference voltage to be compared with the output of ADC 808. In some embodiments, reference voltage generator 812 selects one reference voltage among a plurality of selectable voltages $V_0 \ldots V_M$, where M is an integer number greater than 1. The larger the value of M, the greater the resolution with which the circuit determines the voltage of the signal. Comparator 814 outputs a plurality of output values. A first output value results from the comparison of the numerical value obtained by sampling the signal at $t=t_0$ with the selected reference voltage, a second output value results from the comparison of the numerical value obtained by sampling the signal at $t=T+t_0$ with the selected reference voltage, a third output value results from the comparison of the numerical value obtained by sampling the signal at $t=2T+t_0$ with the selected reference voltage, etc. The output values represent, in essence, a digitized version of the signal received by ADC 808.

The output of the comparator is provided as input to TDR circuit 820. TDR circuit 820 may be programmed to determine a characteristic of the defect based on the output values. For example, TDR circuit 820 may be programmed to determine the location of the defect based on the difference between the time of the second signal transition 311 and the time of the first signal transition 310. Additionally, or alternatively, TDR circuit 820 may be programmed to determine the magnitude of the impedance of the defect based on the voltage of the signal after the second signal transition 311. Additionally, or alternatively, TDR circuit 820 may be programmed to determine whether the defect is a short, an open circuit, a poorly soldered connection, an unusually high-resistance pin, based on the voltage of the signal after the second signal transition 311.

Figure 8C:
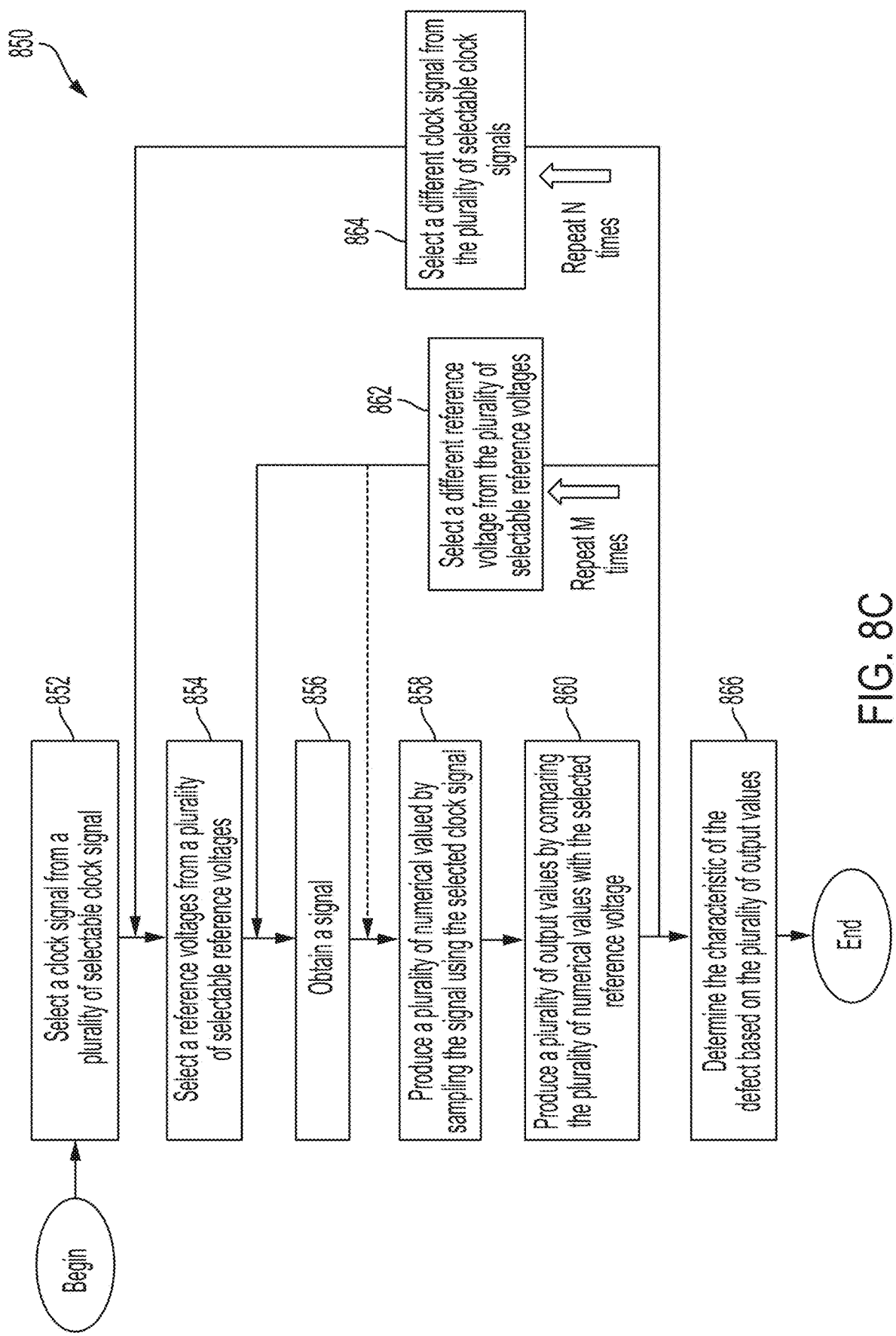
FIG. 8C is a flowchart illustrating a representative method for determining a characteristic of a defect along an electrical line, according to some non-limiting embodiments.

FIG. 8C is a flowchart illustrating a representative method for determining a characteristic of a defect, according to some non-limiting embodiments. The method of FIG. 8C may be executed using the integrated circuit of FIG. 8A, though any other suitable circuit may be used. The acts of method 850 may be executed in the order depicted in FIG. 8C, or in any other order. Method 850 begins at act 852, in which a clock signal is selected from a plurality of selectable clock signals. The plurality of clock signals may be delayed versions of a master clock signal, where each clock signal is delayed by a different amount. In some embodiments, selecting a clock signals comprises selecting a delay value and delaying the master clock signal by an amount that corresponds to the selected delay value.

At act 854, a reference voltage is selected among a plurality of M selectable voltages. The selectable voltages may be, for example, between 0 and $V_{DD}$ or between $-V_{DD}$ and $V_{DD}$.

At act 856, a signal is obtained by producing a first signal transition onto an electrical line, and by receiving a second signal transition arising in response to a reflection of the first signal transition from the defect. Hence, the signal includes the first signal transition and the second signal transition.

At act 858, a plurality of numerical values are produced by sampling the signal using the selected clock signal. For example, a first numerical value is produced at or after a first edge (rising or falling) of the selected clock signal, a second numerical value is produced at or after a second edge of the selected clock signal, a third numerical value is produced at or after a third edge of the selected clock signal, etc.

At act 860, a plurality of output values are produced by comparing the plurality of numerical values to the selected reference voltage. For example, a first output value is produced by comparing the first numerical value of act 858 with the selected reference voltage, a second output value is produced by comparing the second numerical value of act 858 with the selected reference voltage, a third output value is produced by comparing the third numerical value of act 858 with the selected reference voltage, etc.

Method 850 may proceed iteratively. For example, method 850 may loop over the selectable reference voltages and may loop over the selectable clock signals. In some embodiments, the loop over the selectable reference voltages is the inner loop and the loop over the selectable clock signals is the outer loop, as depicted in the example of FIG. 8C. In other embodiments, the loop over the selectable reference voltages is the outer loop and the loop over the selectable clock signals is the inner loop.

Act 862 represents the loop over the reference voltages. At act 862, a reference voltage is selected that is different from the reference voltage selected at the previous iteration. Subsequently, another signal is obtained (act 856), a plurality of numerical values are produced (act 858), and a plurality of output values are produced (act 860). The loop over the reference voltages is repeated M times, where M is the number of selectable reference voltages. Optionally, the loop over the reference voltages may not include act 856, as depicted by the dashed line of FIG. 8C.

Act 864 represents the loop over the clock signals. At act 864, a clock signal is selected that is different from the clock signal selected at the previous iteration. Subsequently, a reference voltage is selected (act 854), another signal is obtained (act 856), a plurality of numerical values are produced (act 858), a plurality of output values are produced (act 860), and the loop over the reference voltages is repeated again M times. The loop over the clock signals is repeated N times, where N is the number of selectable clock signals. Thus, method 850 involves M×N iterations.

At act 866, a characteristic of the defect is determined based on the plurality of output values obtained over the M×N iterations. Examples of characteristics that may be determined at act 866 include the location of the defect, the impedance of the defect and the nature of the defect. In some embodiments, the location of the defect may be determined based on the time elapsed between a first signal transition and a second signal transition. In some embodiments, the impedance may of the defect may be determined based on the voltage level following the second signal transition relative to the voltage level prior to the second signal transition.

Figure 8D:
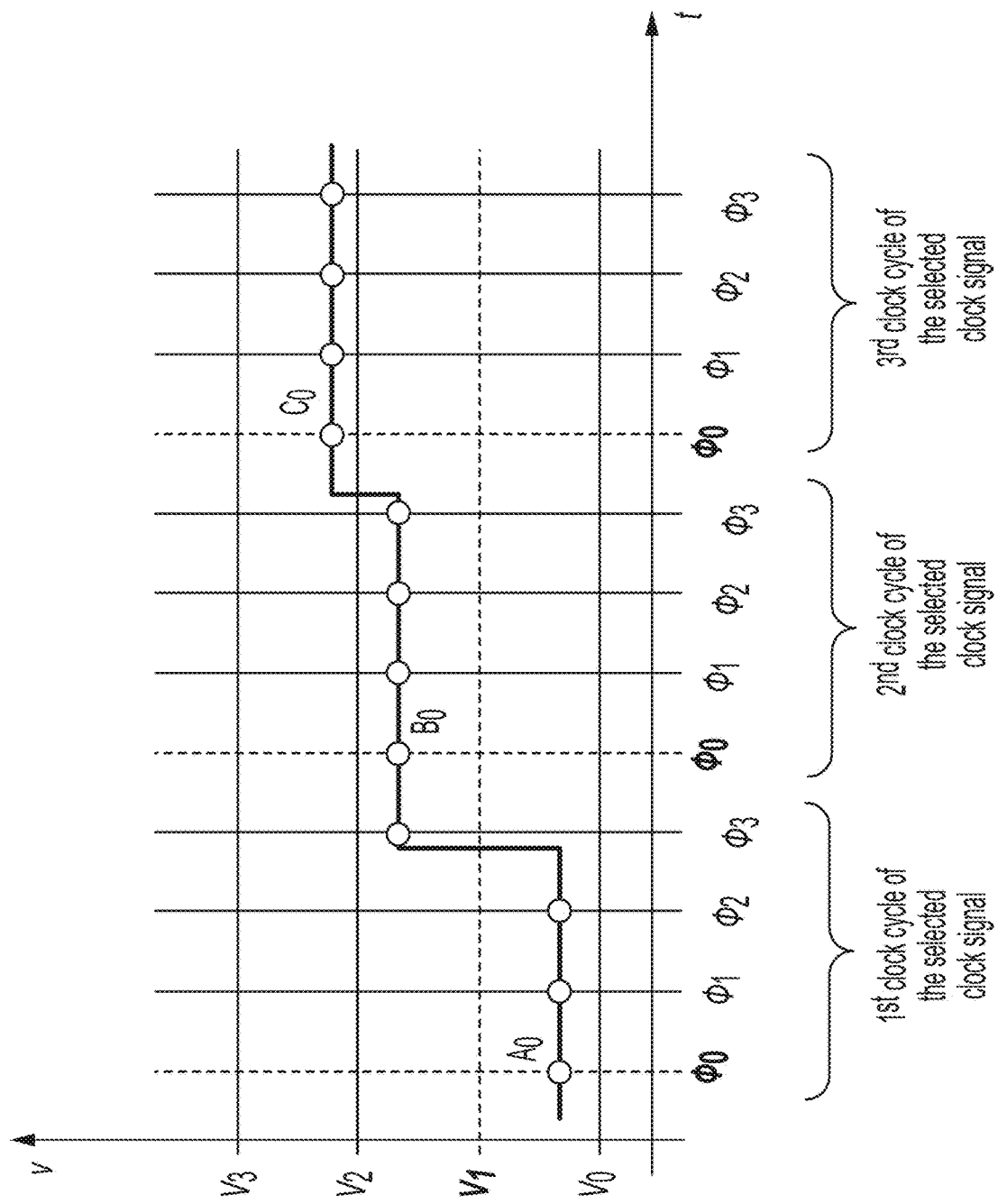
FIG. 8D is a plot illustrating how a signal may be sampled over several clock cycles, over several loops over the selectable clock signals and over several reference voltages, in accordance with some non-limiting embodiments.

FIG. 8D is a plot illustrating how a signal may be sampled over several clock cycles, over several loops for the selectable clock signals and over several loops for the reference voltages, in accordance with some embodiments. Tables 8E-8H represent the outputs of the comparator 814. In this non-limiting example, the selectable clock signals are $\Phi_0$, $\Phi_1$, $\Phi_2$ and $\Phi_3$, and the selectable reference voltages are $V_0$, $V_1$, $V_2$ and $V_3$, though any other suitable numbers of clock signals and reference voltages may be used.

With reference to FIG. 8D and the table of FIG. 8E, the control circuit first selects clock signal $\Phi_0$ and reference voltage $V_0$. In this loop, ADC 808 obtains, from the first instance of the signal, numerical value $A_0$ in the first clock cycle, numerical value $B_0$ in the second clock cycle and numerical value $C_0$ in the third clock cycle. Numerical values greater that the selected reference voltage result in the comparator producing a 1, while numerical values less than the selected reference voltage result in the comparator producing a 0 (though the opposite logic is also possible). Thus, when compared with reference voltage $V_0$, comparator 814 produced the following output values: 1 (at the first clock cycle), 1 (at the second clock cycle) and 1 (at the third clock cycle), as shown in the first row of the table of FIG. 8E.

Subsequently, a different reference voltage is selected: $V_1$. This time, as shown in the second row of the table of FIG. 8E, the output values are: 0 (at the first clock cycle), 1 (at the second clock cycle) and 1 (at the third clock cycle). The control circuit continues to loop over the selectable reference voltages. The subsequent output values are reflected in the last two rows of the table of FIG. 8E.

Subsequently, the control circuit selects a difference clock signal, $\Phi_1$, and loops over the reference voltages. The output values when this clock signal is selected are shown in the table of FIG. 8F. Subsequently, the control circuit selects a difference clock signal, $\Phi_2$, and loops over the reference voltages. The output values when this clock signal is selected are shown in the table of FIG. 8G. Lastly, the control circuit selects a difference clock signal, $\Phi_3$, and loops over the reference voltages. The output values when this clock signal is selected are shown in the table of FIG. 8H.

The output values of the tables of FIGS. 8E-8H are stored in a memory of the control circuit, and are used to reconstruct the shape of the signal in the digital domain. The reconstructed signal can be post-processed to determine any characteristic of interest to the user, such as the location, impedance or nature of a defect.

As described above, some embodiments are directed to methods involving a loop arranged such that a different clock signal having a different delay is selected at each iteration of the loop. In this way, the portion of interest of the signal can be scanned with a reasonably high resolution in spite of using a relatively low-speed clock. Other embodiments, however, may scanning the signal involve a single clock signal but several replicas of the signal, where each replica has a different delay. Thus, instead of iterating over multiple selectable clock cycles, the method iterates over multiple selectable TDR signals.

Notwithstanding, the inventors has appreciated that, compared to methods that iterate over TDR signals having different delays, iterating over the selectable clock signals with different delays may reduce costs associated with the design and fabrication of the integrated circuit. This is particularly true in systems in which the transmitter hardware serves both as data transmitter and TDR transmitter. In these cases, in fact, enabling an integrated circuit to iterate over TDR signals having different delays involves redesigning at least part of a transmitter hardware that is already designed to perform data transmission. Vice versa, enabling an integrated circuit to iterate over clock signals having different delays can simply involve stamping a transmitter hardware template on the integrated circuit and adding, next to it, circuitry for selecting the different clock signals. This approach is more cost-efficient because its implementation may rely on pre-existing without transmitter hardware template.

VII. Conclusion

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including", "comprising", "having", "containing" or "involving" and variations thereof herein, is meant to encompass the items listed thereafter and equivalents thereof as well as additional items.

The use of "coupled" or "connected" is meant to refer to circuit elements, or signals, that are either directly linked to one another or through intermediate components.

What is claimed is:

1. A method for determining a characteristic of a defect in an electrical line of an electronic system, the method comprising:
    (i) selecting a first clock signal among a plurality of selectable clock signals;
    (ii) selecting a first reference voltage among a plurality of selectable reference voltages;
    (iii) obtaining a signal by:
        producing a first signal transition onto the electrical line; and
        receiving a second signal transition arising in response to a reflection of the first signal transition from the defect;
    (iv) producing a plurality of numerical values by sampling the signal using the selected clock signal;
    (v) producing a plurality of output values by comparing the plurality of numerical values with the selected reference voltage; and
    (vi) determining the characteristic of the defect based on the plurality of output values.

2. The method of claim 1, further comprising:
    (vii) selecting a second reference voltage different from the first reference voltage; and
    (viii) repeating (iii)-(vi).

3. The method of claim 2, further comprising:
    (ix) selecting a second clock signal different from the first clock signal; and
    (x) repeating (ii)-(vi).

4. The method of claim 1, wherein selecting the first clock signal among the plurality of selectable clock signals comprises selecting a delay value from a plurality of selectable delay values and delaying a master clock signal by an amount corresponding to the selected delay value.

5. The method of claim 1, wherein determining the characteristic of the defect based on the plurality of output values comprises determining a location of the defect based on the plurality of output values.

6. The method of claim 1, wherein determining the characteristic of the defect based on the plurality of output values comprises determining an impedance of the defect based on the plurality of output values.

7. The method of claim 1, wherein determining the characteristic of the defect based on the plurality of output values comprises determining whether the defect is a short or an open circuit.

8. The method of claim 1, wherein the plurality of selectable clock signals represent delayed versions of a master clock signal.

9. The method of claim 1, wherein producing the first signal transition onto the electrical line is performed using a signal driver, and wherein the method further comprises:
    generating data comprising a plurality of bits representing information to be sent to a data receiver; and
    with the signal driver, outputting the data onto the electrical line.

10. An apparatus for determining a characteristic of a defect in an electrical line of an electronic system, the apparatus comprising:
    an integrated circuit (IC) configured to:
        (i) select a first clock signal among a plurality of selectable clock signals;
        (ii) select a first reference voltage among a plurality of selectable reference voltages;
        (iii) obtain a signal by:
            producing a first signal transition onto the electrical line; and
            receiving a second signal transition arising in response to a reflection of the first signal transition from the defect;
        (iv) produce a plurality of numerical values by sampling the signal using the selected clock signal;
        (v) produce a plurality of output values by comparing the plurality of numerical values with the selected reference voltage; and
        (vi) determine the characteristic of the defect based on the plurality of output values.

11. The apparatus of claim 10, wherein the IC is further configured to:
    (vii) select a second reference voltage different from the first reference voltage; and
    (viii) repeat (iii)-(vi).

12. The apparatus of claim 11, wherein the IC is further configured to:
    (ix) select a second clock signal different from the first clock signal; and
    (x) repeat (ii)-(vi).

13. The apparatus of claim 10, wherein selecting the first clock signal among the plurality of selectable clock signals comprises selecting a delay value from a plurality of selectable delay values and delaying a master clock signal by an amount corresponding to the selected delay value.

14. The apparatus of claim 10, wherein the plurality of selectable clock signals represent delayed versions of a master clock signal.

15. The apparatus of claim 10, wherein determining the characteristic of the defect based on the plurality of output values comprises determining an impedance of the defect based on the plurality of output values.

16. The apparatus of claim 10, wherein the IC is further configured to:
    generate data comprising a plurality of bits representing information to be sent to a data receiver; and
    output the data onto the electrical line.

17. An apparatus comprising:
    an integrated circuit (IC) comprising:
        a transmitter;
        a signal driver coupled to the transmitter and to an electrical line;

an analog-to-digital converter (ADC) coupled to the electrical line;

a clock selection circuit coupled to a clock input of the ADC, the clock selection circuit being configured to select a first clock signal among a plurality of selectable clock signals;

a reference voltage generator configured to select a reference voltage among a plurality of selectable reference voltages;

a comparator having a first input coupled to the ADC and a second input coupled to the reference voltage generator; and a time-domain reflectometry (TDR) circuit coupled to an output of the comparator.

18. The apparatus of claim 17, wherein the clock selection circuit is configured to select a delay value among a plurality of selectable delay values and to select the first clock signal based on the selected delay value.

19. The apparatus of claim 17, further comprising a switch coupling the ADC to the electrical line.

20. The apparatus of claim 17, wherein the transmitter is configured to output a plurality of bits of information.

\* \* \* \* \*